(12) United States Patent
Cheng et al.

(10) Patent No.: US 12,272,726 B2
(45) Date of Patent: *Apr. 8, 2025

(54) SEMICONDUCTOR STRUCTURE WITH NANOSTRUCTURE

(71) Applicant: Taiwan Semiconductor Manufacturing Company, Ltd., Hsinchu (TW)

(72) Inventors: Chao-Ching Cheng, Hsinchu (TW); I-Sheng Chen, Taipei (TW); Tzu-Chiang Chen, Hsinchu (TW); Shih-Syuan Huang, Taichung (TW); Hung-Li Chiang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/487,213

(22) Filed: Oct. 16, 2023

(65) Prior Publication Data

US 2024/0047526 A1    Feb. 8, 2024

Related U.S. Application Data

(60) Continuation of application No. 17/532,681, filed on Nov. 22, 2021, now Pat. No. 11,824,088, which is a
(Continued)

(51) Int. Cl.
*H01L 29/76*    (2006.01)
*H01L 21/02*    (2006.01)
(Continued)

(52) U.S. Cl.
CPC .... *H01L 29/0673* (2013.01); *H01L 21/02603* (2013.01); *H01L 21/823431* (2013.01);
(Continued)

(58) Field of Classification Search
CPC ....... H01L 21/02603; H01L 21/823431; H01L 21/823821; H01L 27/0886; H01L 27/0924;
(Continued)

(56) References Cited

U.S. PATENT DOCUMENTS 9,209,247 B2    12/2015    Colinge et al.
9,236,267 B2    1/2016    De et al.
(Continued)

FOREIGN PATENT DOCUMENTS

TW    201736249 A    10/2017

OTHER PUBLICATIONS

U.S. Notice of Allowance for U.S. Appl. No. 16/868,625, dated Sep. 30, 2021.

*Primary Examiner* — Theresa T Doan
(74) *Attorney, Agent, or Firm* — Birch, Stewart, Kolasch & Birch, LLP

(57) ABSTRACT

Semiconductor structures and method for forming the same are provided. The semiconductor structure includes a substrate and nanostructures formed over the substrate and spaced apart from each other in a first direction. The semiconductor structure further includes a gate structure wrapping around the nanostructures and a semiconductor layer attached to the nanostructures in a second direction different from the first direction. The semiconductor structure further includes inner spacers sandwiched between the semiconductor layer and the gate structure in the second direction and a silicide layer formed over the semiconductor layer. In addition, a first portion of the semiconductor layer is sandwiched between the inner spacers and the silicide layer in the second direction.

20 Claims, 19 Drawing Sheets

Related U.S. Application Data division of application No. 16/681,097, filed on Nov. 12, 2019, now Pat. No. 11,183,560, which is a continuation of application No. 15/979,123, filed on May 14, 2018, now Pat. No. 10,522,622.

(51) Int. Cl.

| | |
|---|---|
| *H01L 21/8234* | (2006.01) |
| *H01L 21/8238* | (2006.01) |
| *H01L 27/088* | (2006.01) |
| *H01L 27/092* | (2006.01) |
| *H01L 29/06* | (2006.01) |
| *H01L 29/423* | (2006.01) |
| *H01L 29/66* | (2006.01) |
| *H01L 29/78* | (2006.01) |
| *H01L 29/94* | (2006.01) |

(52) U.S. Cl.
CPC .. *H01L 21/823821* (2013.01); *H01L 27/0886* (2013.01); *H01L 27/0924* (2013.01); *H01L 29/42392* (2013.01); *H01L 29/66545* (2013.01); *H01L 29/66795* (2013.01); *H01L 29/785* (2013.01)

(58) Field of Classification Search
CPC ......... H01L 29/42392; H01L 29/66545; H01L 29/66795; H01L 29/785; H01L 21/823814; H01L 29/0653; H01L 29/0847; H01L 29/1079; H01L 29/78696; H01L 21/823412; H01L 21/823418; H01L 29/0669; H01L 29/41791; B82Y 10/00
USPC ......................................................... 257/288
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,882,023 B2 | 1/2018 | Lin et al. |
| 11,245,005 B2 | 2/2022 | Lin et al. |
| 11,923,413 B2 * | 3/2024 | Lin ................... H01L 21/02603 |
| 2012/0305886 A1 | 12/2012 | Sleight et al. |
| 2015/0295089 A1 | 10/2015 | Huang et al. |
| 2017/0069481 A1 | 3/2017 | Doris et al. |

* cited by examiner

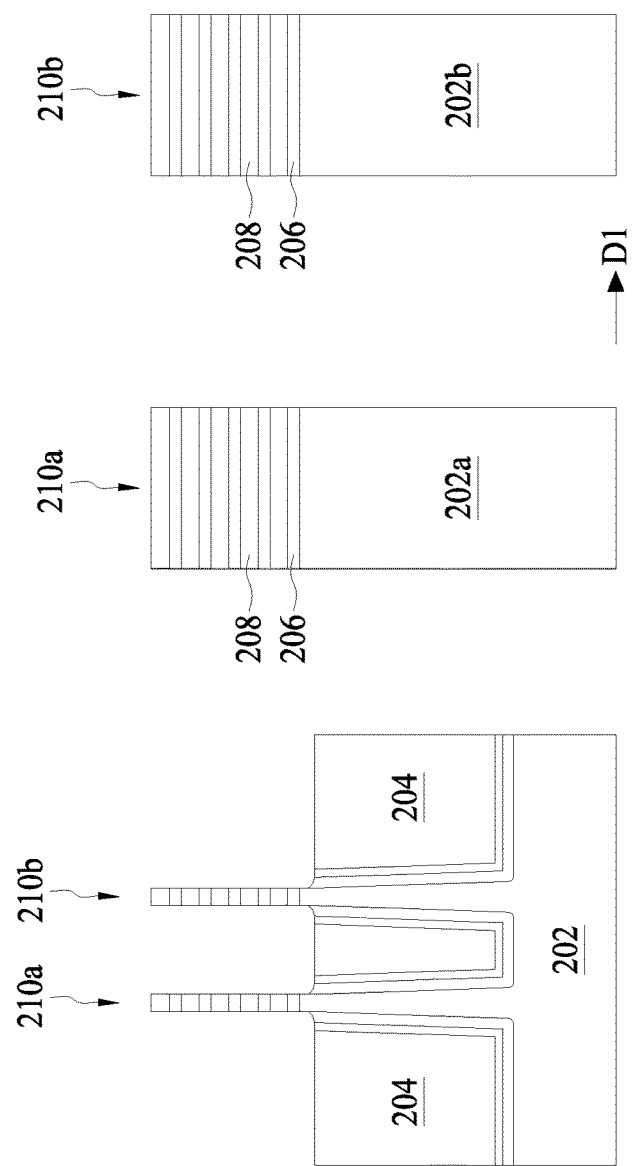
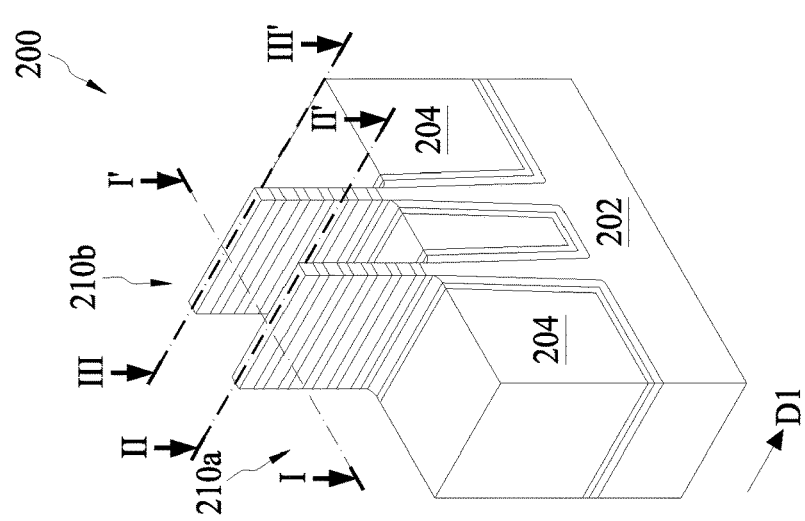
FIG. 3A  FIG. 3B  FIG. 3C  FIG. 3D

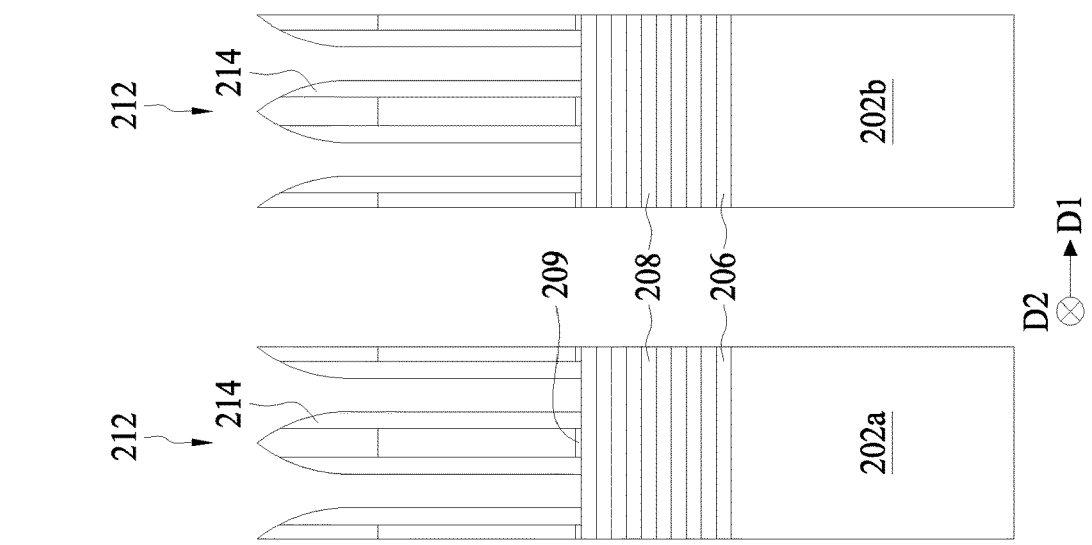
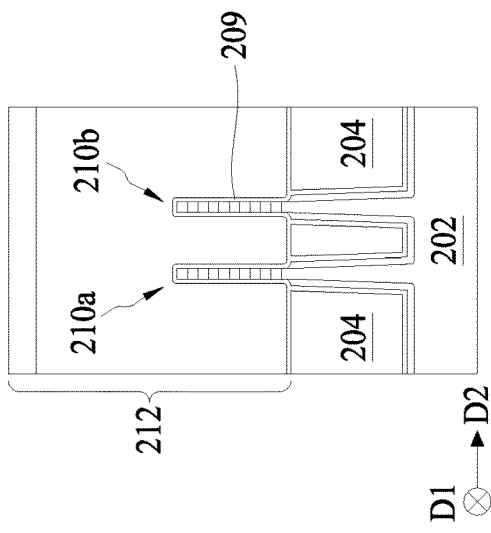
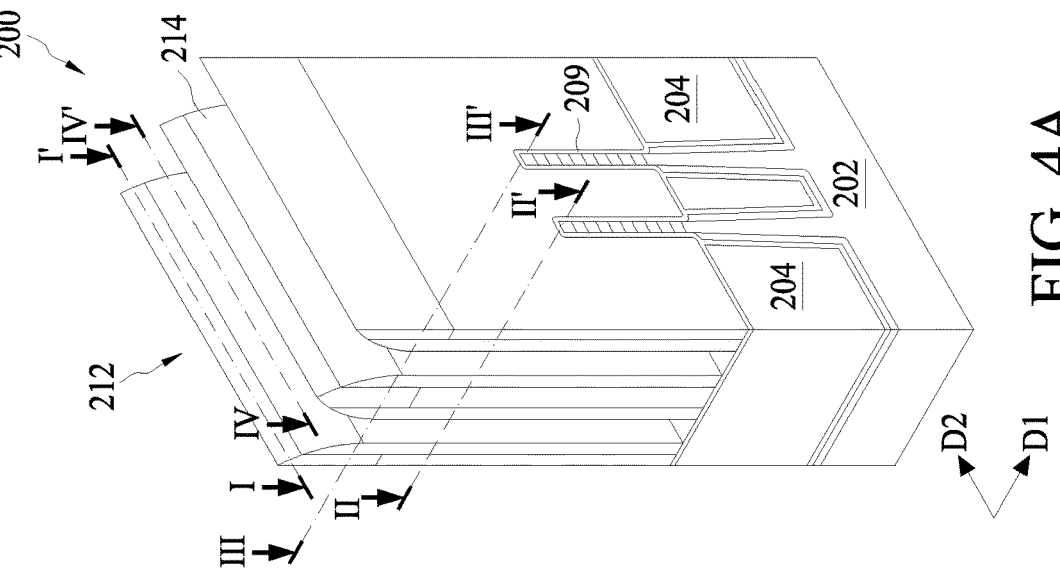
FIG. 4D    FIG. 4C
FIG. 4B    FIG. 4E
FIG. 4A

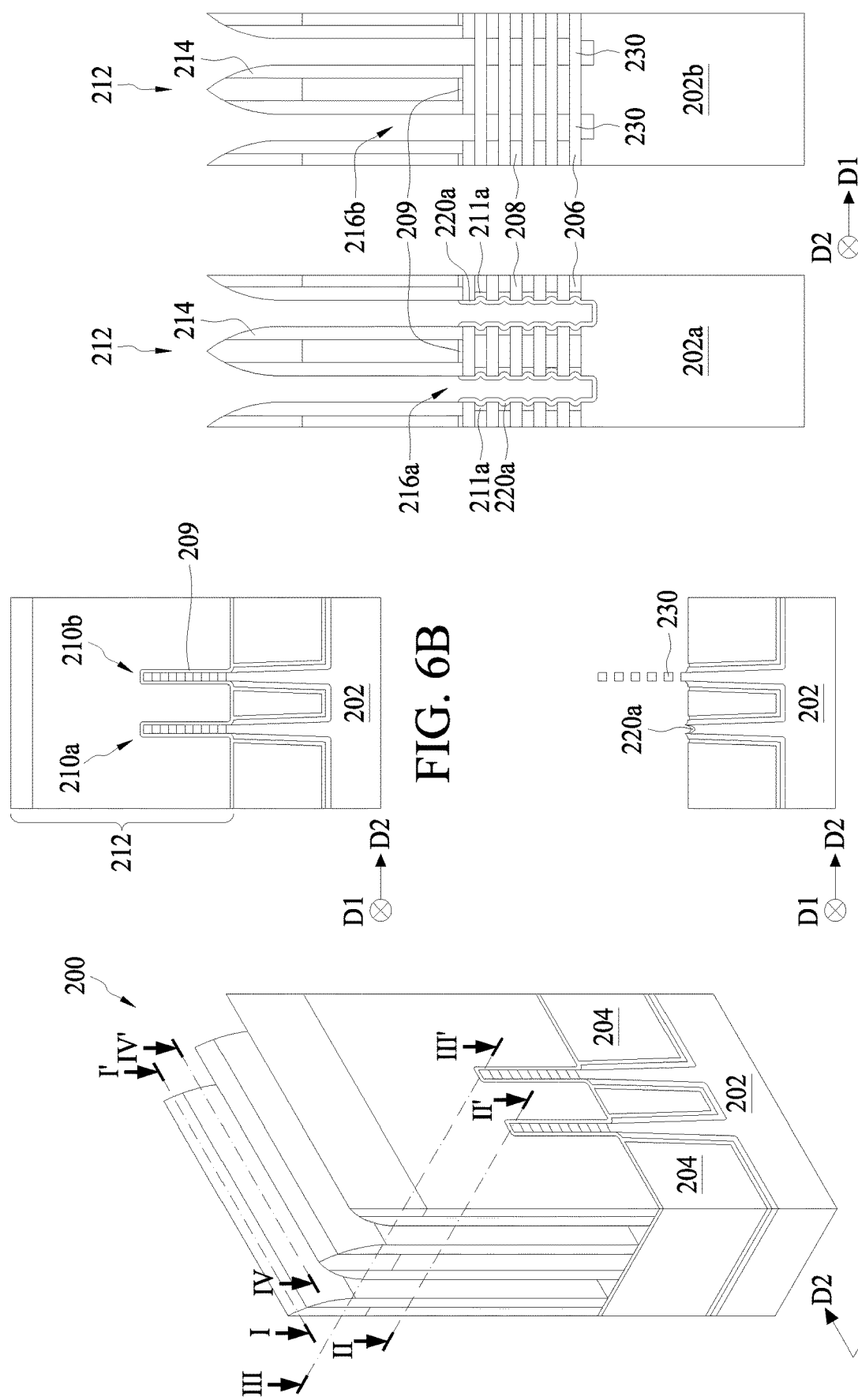

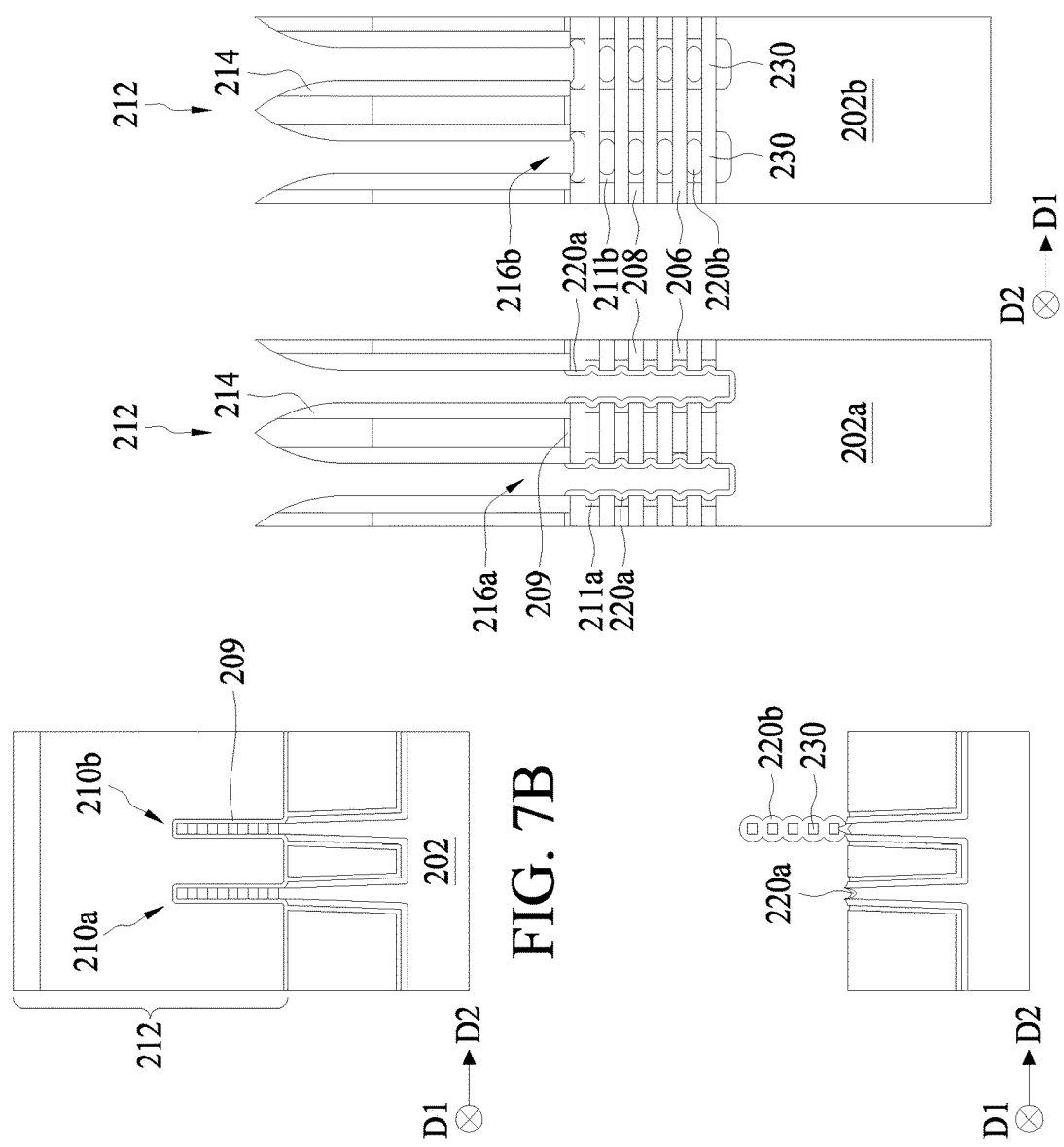
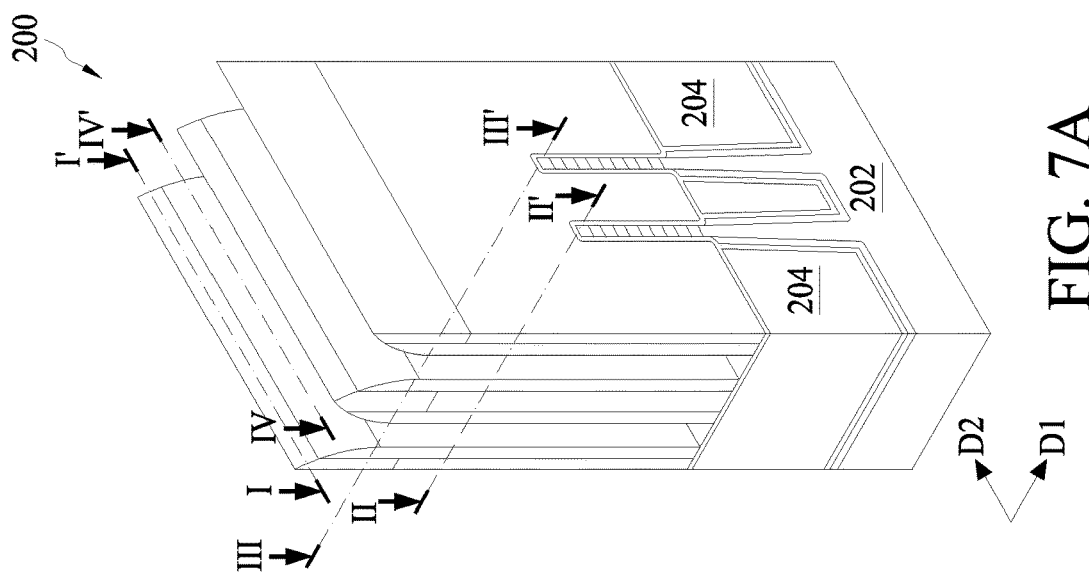
FIG. 7A  FIG. 7B  FIG. 7C  FIG. 7D  FIG. 7E

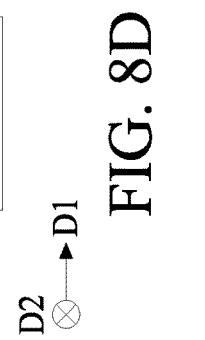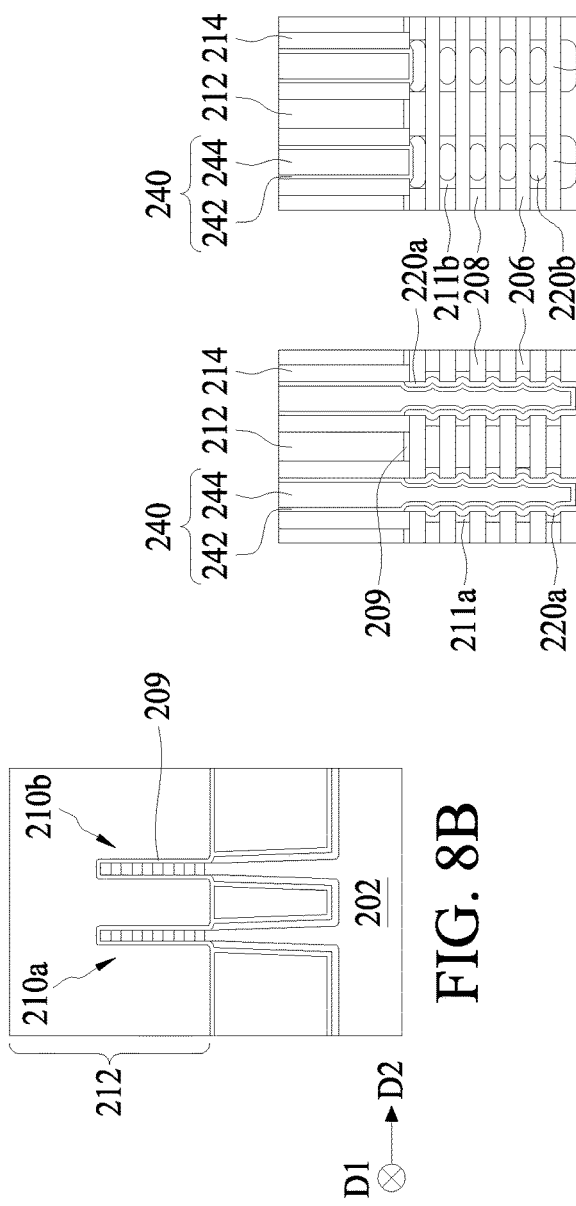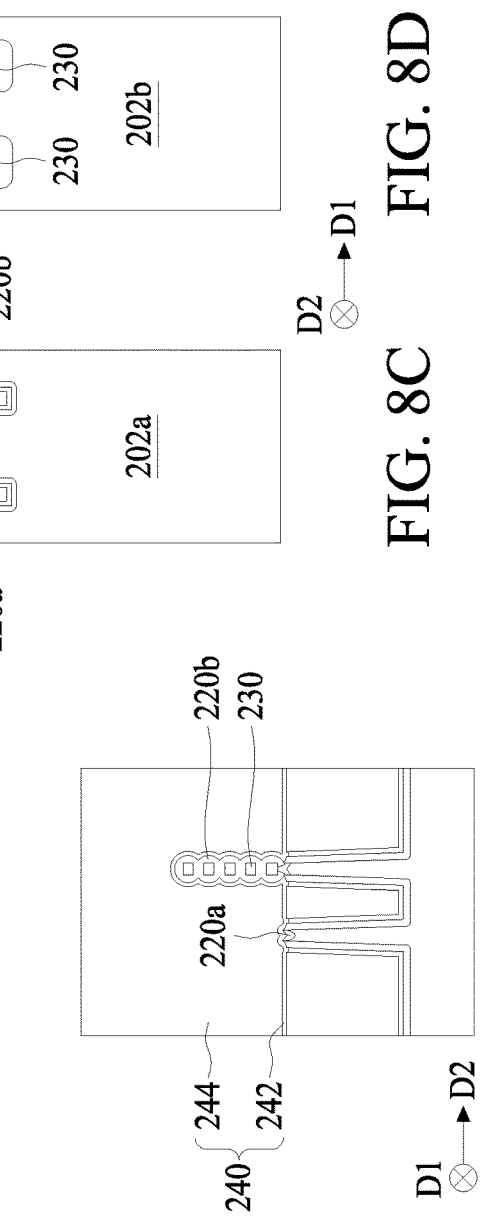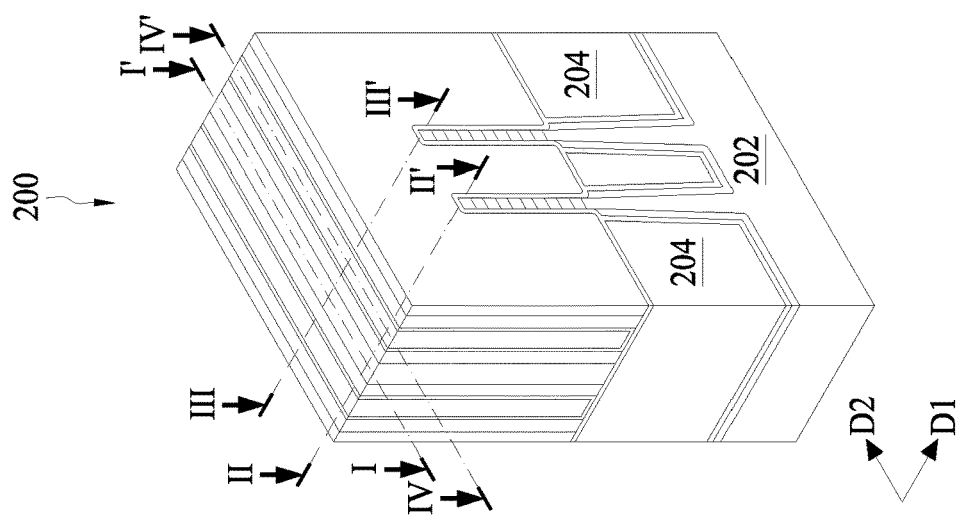

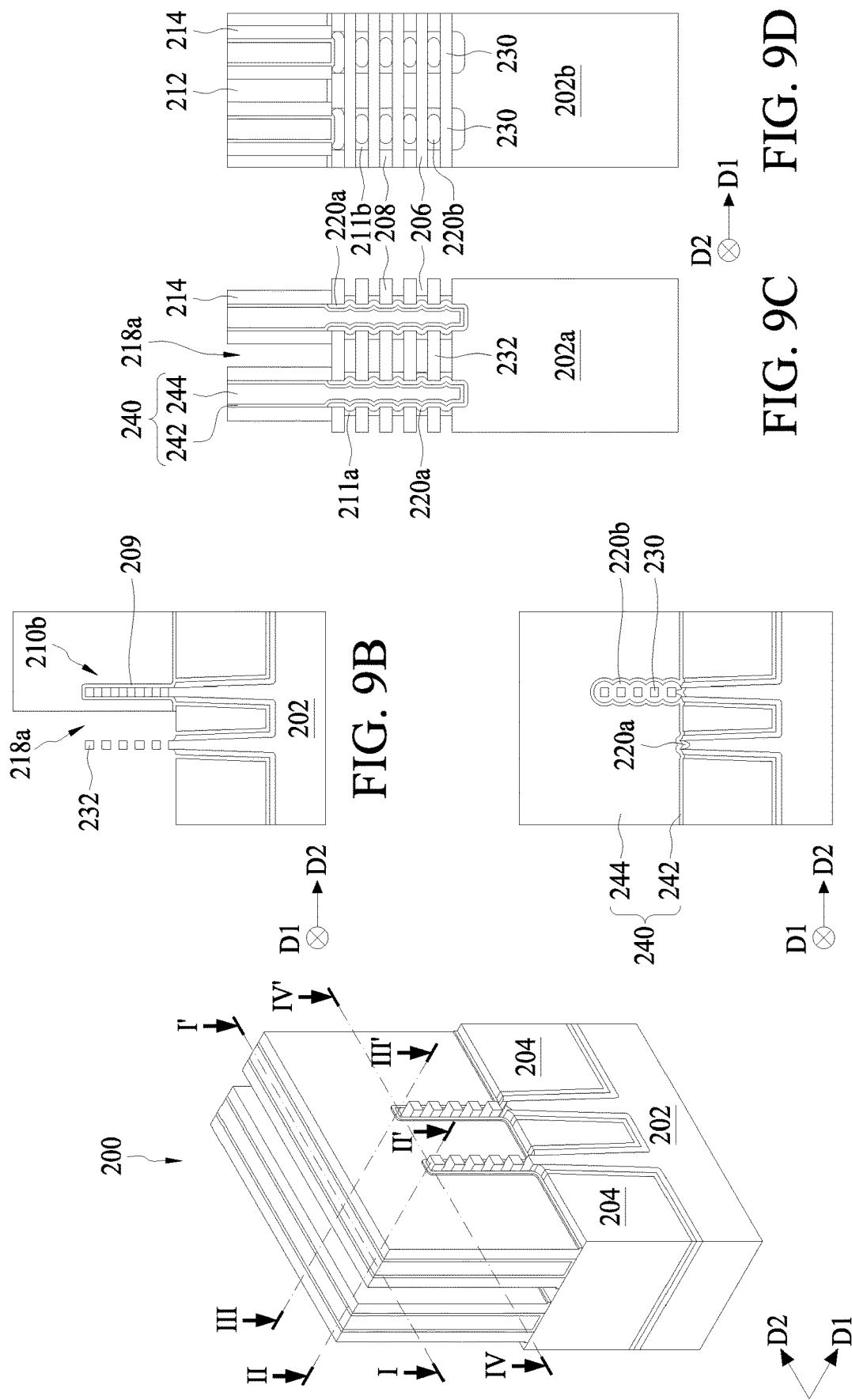

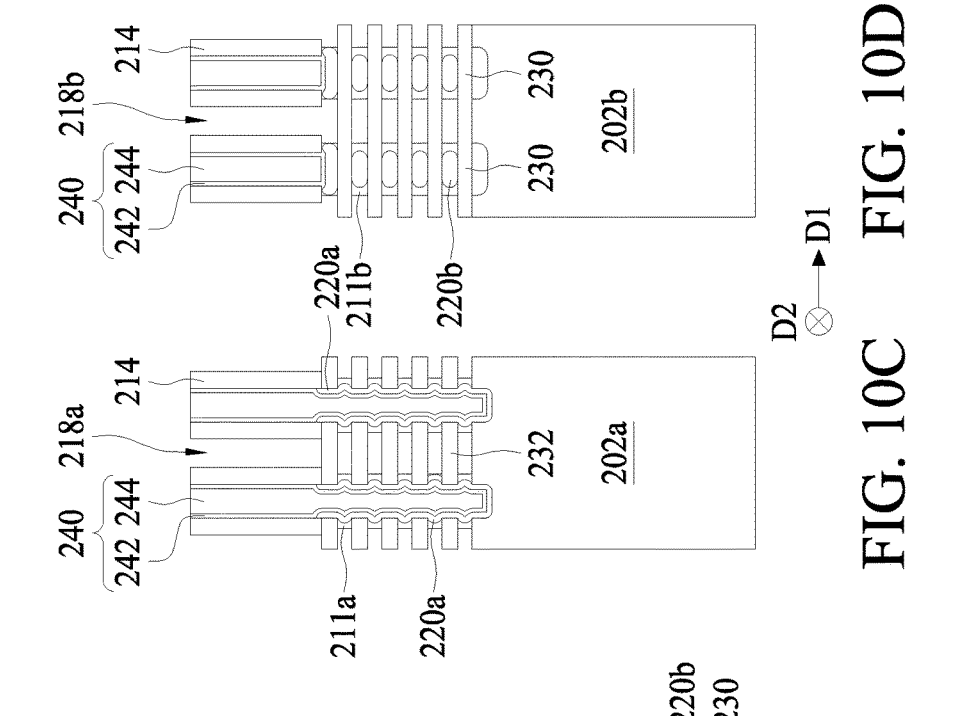
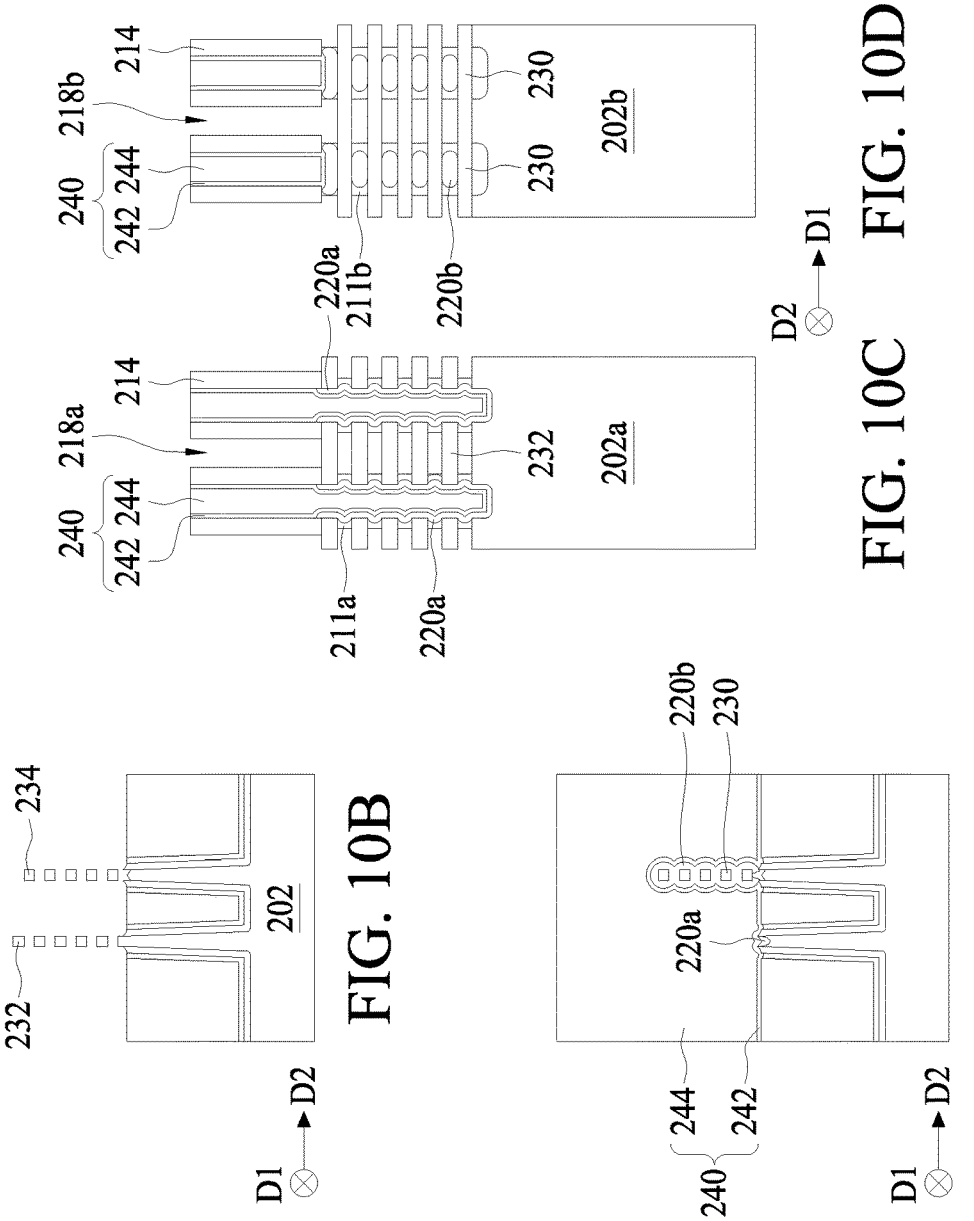
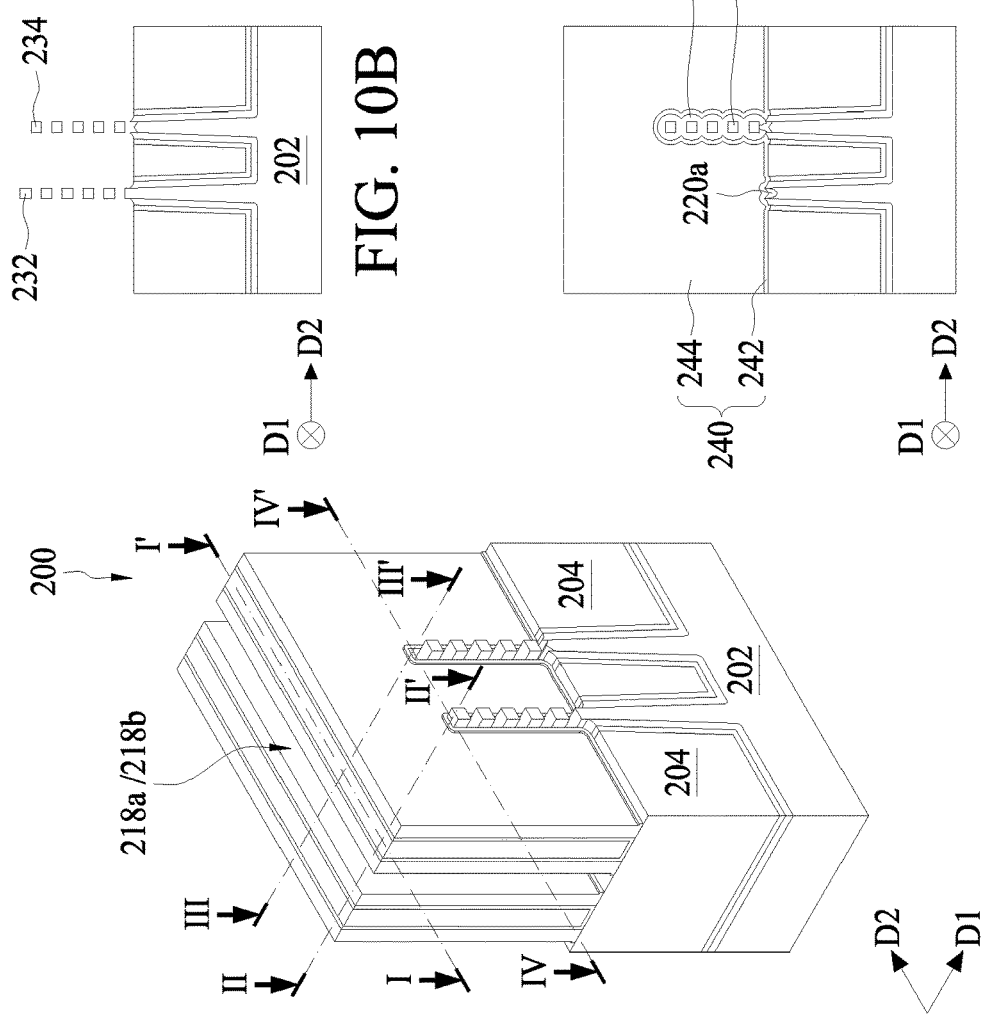

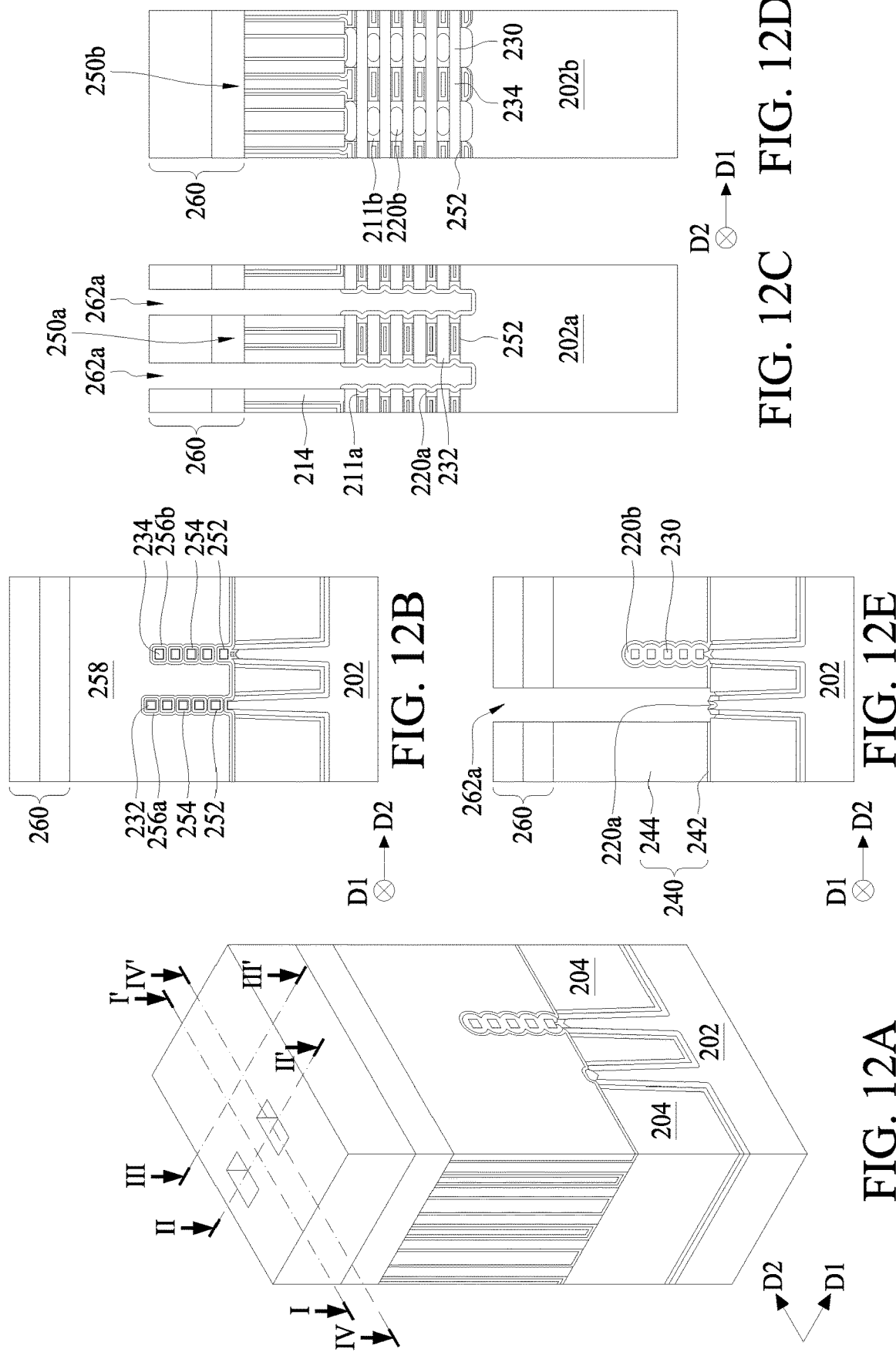

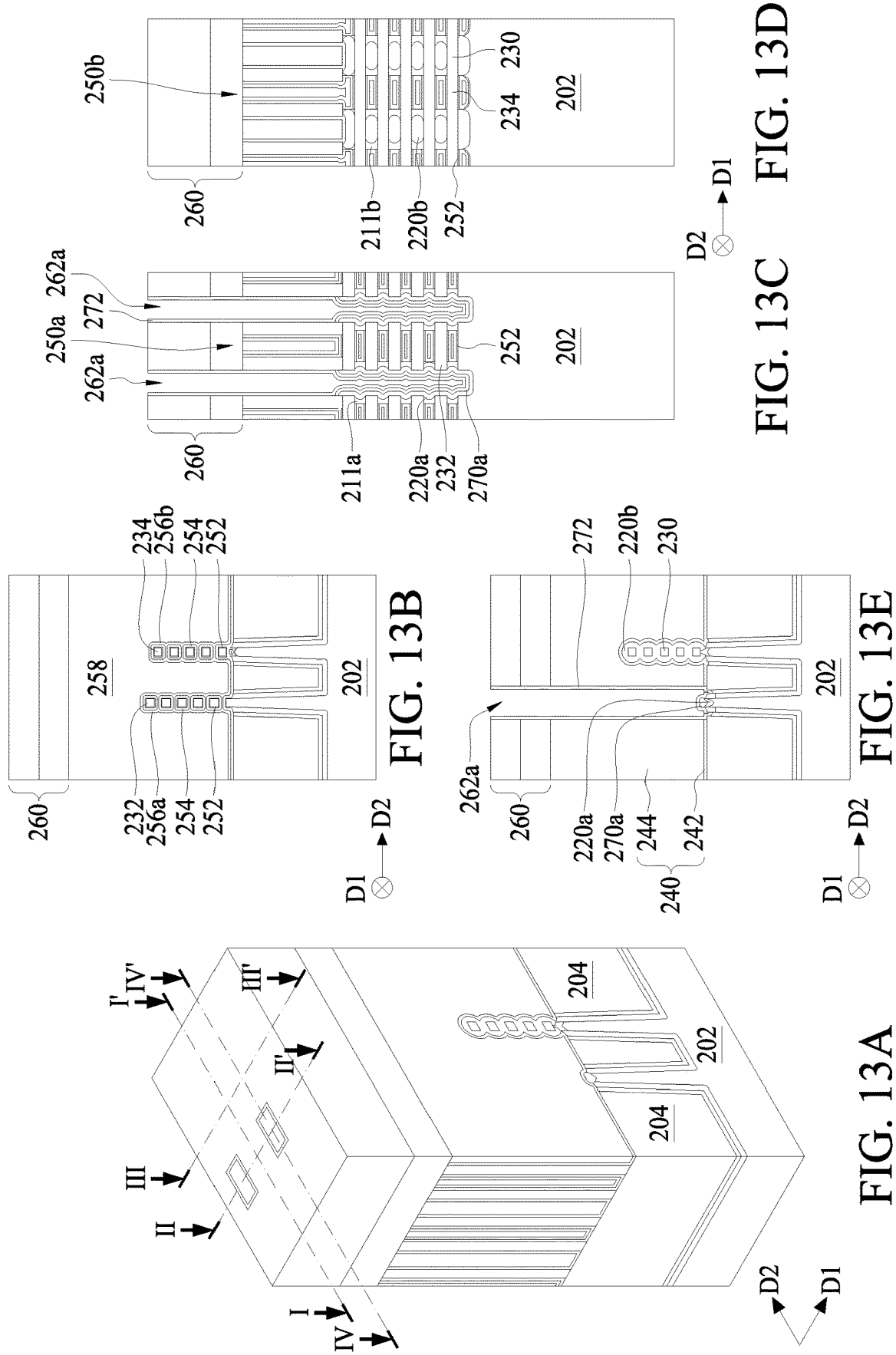

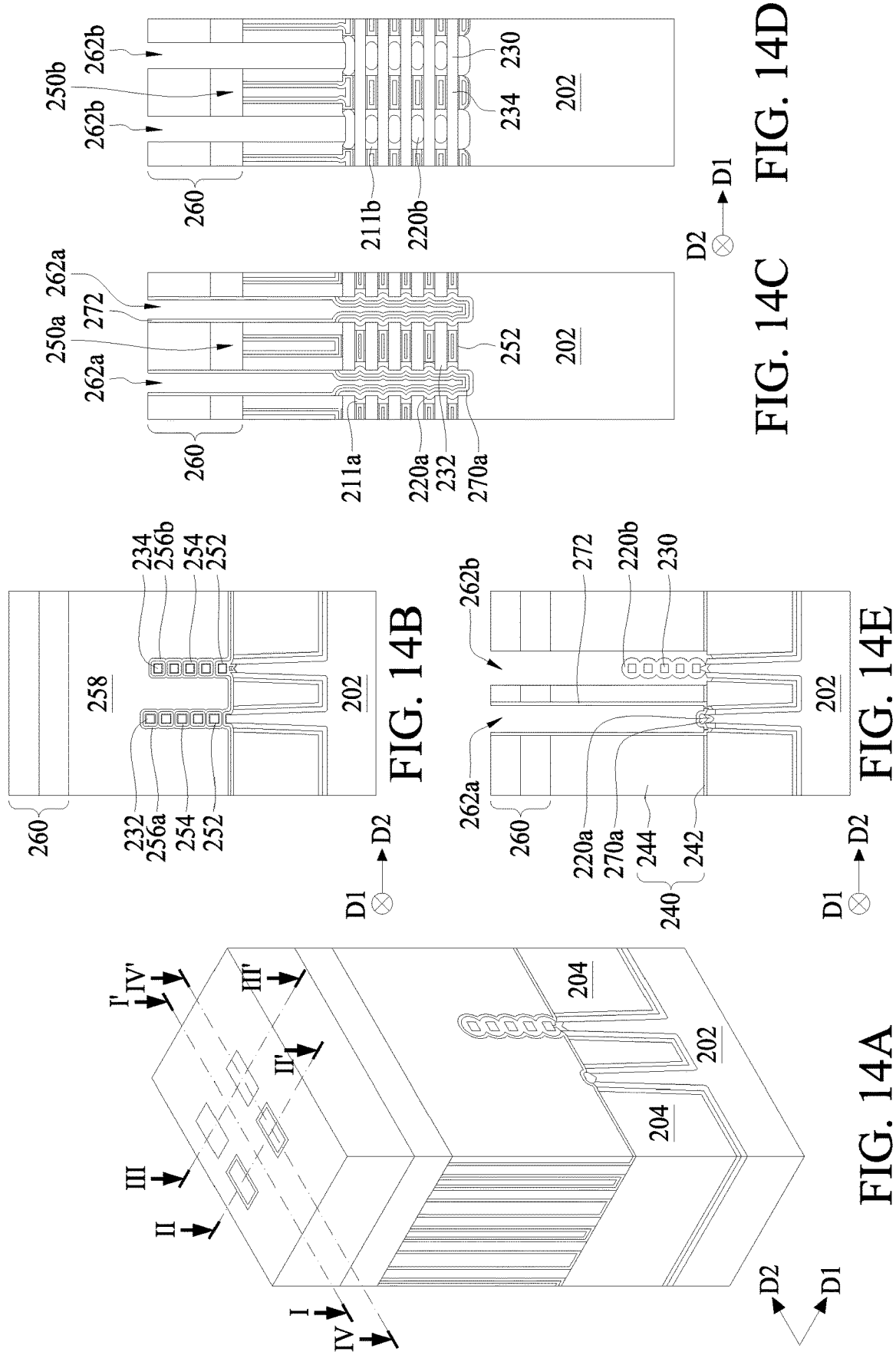

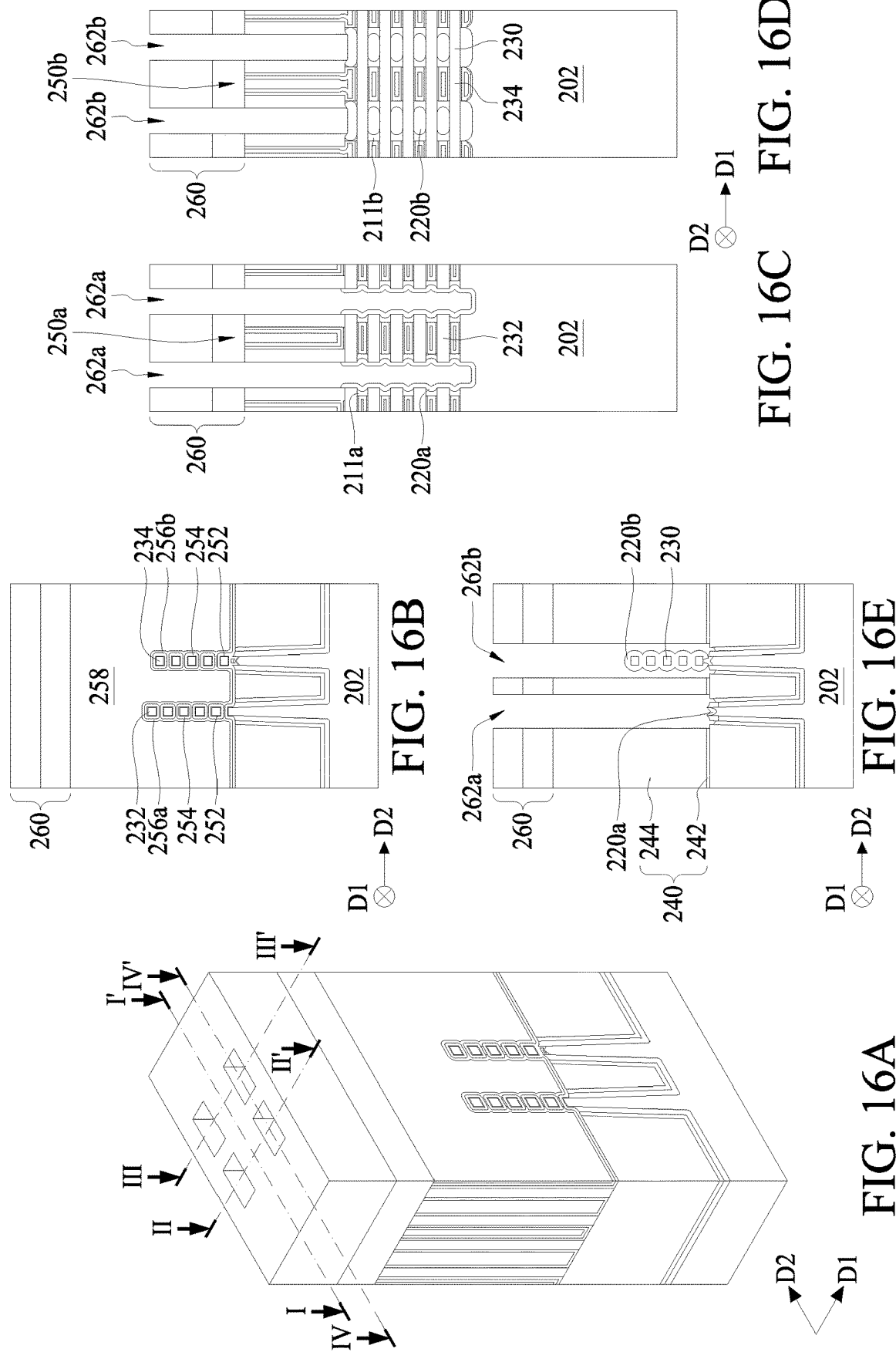

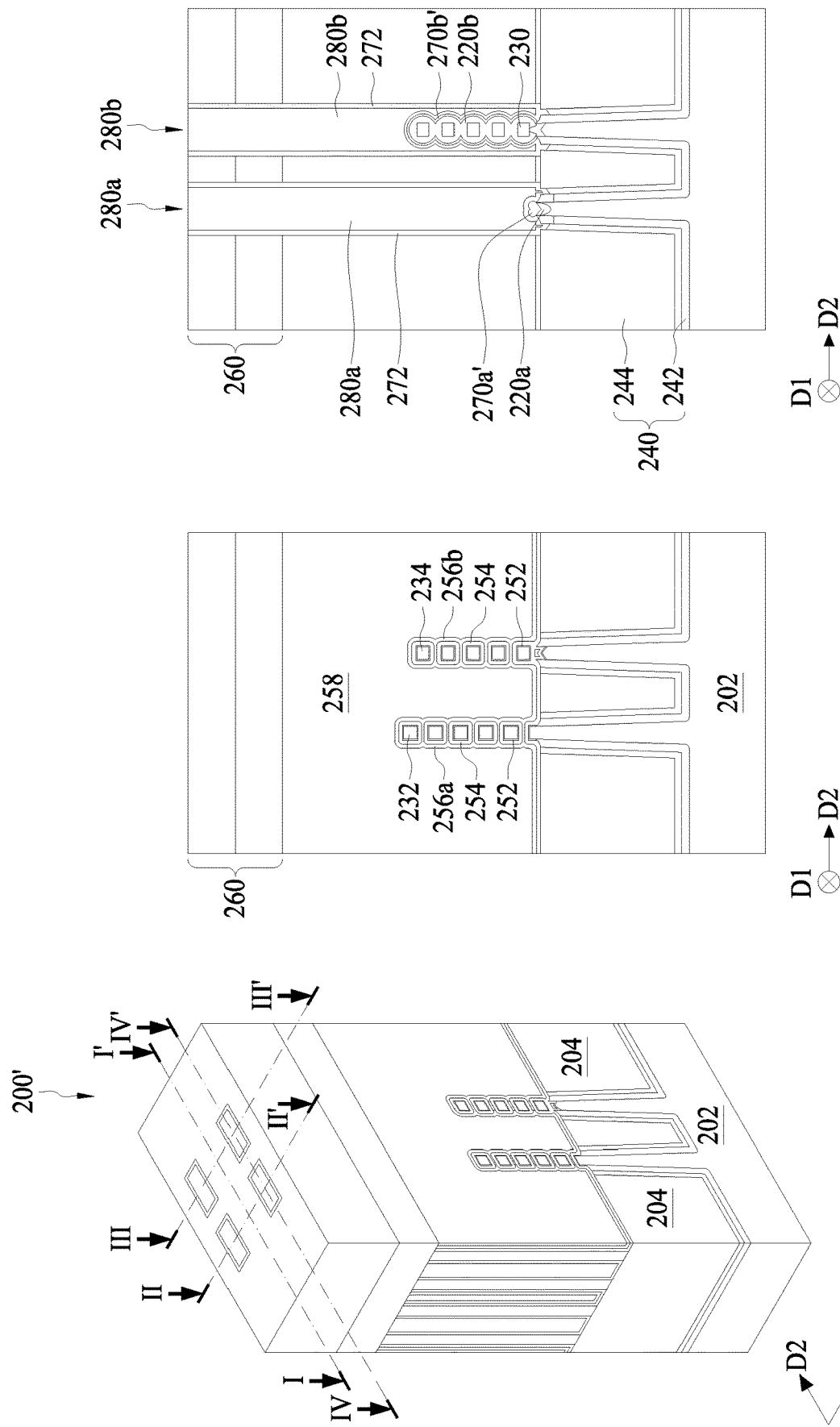

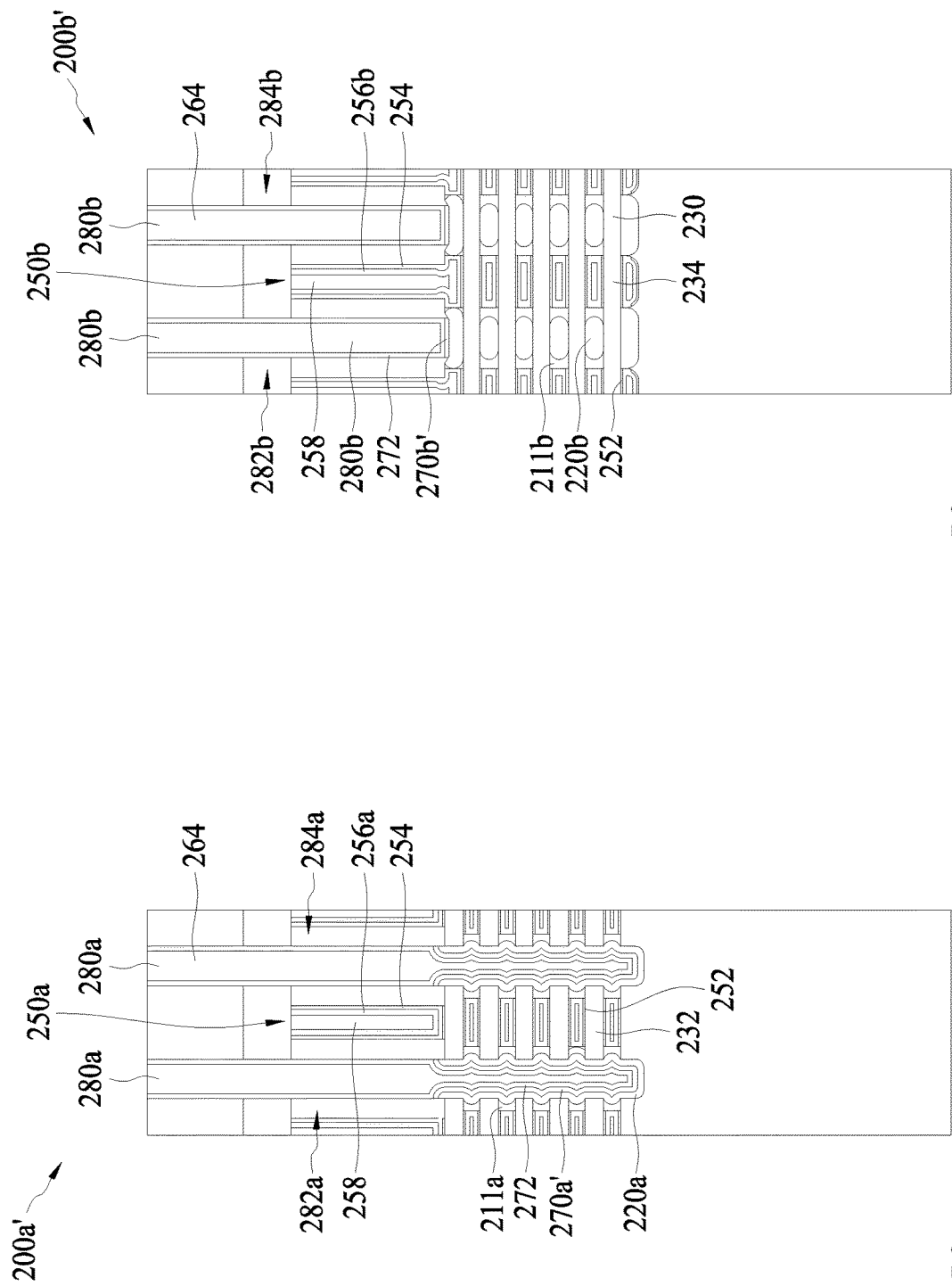

SEMICONDUCTOR STRUCTURE WITH NANOSTRUCTURE

CROSS REFERENCE TO RELATED APPLICATIONS

This application is a Continuation application of U.S. patent application Ser. No. 17/532,681, filed on Nov. 22, 2021, which is a Divisional application of U.S. patent application Ser. No. 16/681,097, filed on Nov. 12, 2019, which is a Continuation application of U.S. patent application Ser. No. 15/979,123, filed on May 14, 2018, the entirety of which are incorporated by reference herein.

BACKGROUND

As the semiconductor industry develops smaller and smaller nanoscale products and processes in pursuit of higher device density, higher performance, and lower costs, the challenges of downscaling both fabrication and design have led to the development of three-dimensional designs, such as multi-gate field effect transistor (FET) including a fin FET (FinFET) and a gate-all-around (GAA) FET. In a FinFET, a gate electrode is positioned adjacent to three side surfaces of a channel region with a gate dielectric layer interposed therebetween. Because the gate structure surrounds the fin on three sides, the transistor essentially has three gates controlling the current through the fin or channel region. However, the fourth side, the bottom part of the channel region, is positioned far away from the gate electrode and thus is not under close gate control. In contrast to a FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain induced barrier lower (DIBL).

Although existing GAA FET devices and methods of fabricating GAA FET devices have been generally adequate for their intended purpose, such devices and methods have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A and 15A illustrate a multi-gate semiconductor device at various fabrication stages constructed according to aspects of one or more embodiments of the present disclosure.

FIGS. 3B, 4B, 5B, 6B, 7B, 8B, 9B, 10B, 11B, 12B, 13B, 14B and 15B are cross-sectional views taken along line I-I' of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 3C, 4C, 5C, 6C, 7C, 8C, 9C, 10C, 11C, 12C, 13C, 14C and 15C are cross-sectional views taken along line II-IT of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 3D, 4D, 5D, 6D, 7D, 8D, 9D, 10D, 11D, 12D, 13D, 14D, and 15D are cross-sectional views taken along line III-III' of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 4E, 5E, 6E, 7E, 8E, 9E, 10E, 11E, 12E, 13E, 14E, and 15E are cross-sectional views taken along line IV-IV' of FIGS. 4A, 5A, 6A, 7A, 8A, 9A, 10A, 11A, 12A, 13A, 14A and 15A, respectively, according to aspects of one or more embodiments of the present disclosure.

FIGS. 16A and 17A illustrate a multi-gate semiconductor device at various fabrication stages constructed according to aspects of one or more embodiments of the present disclosure.

FIGS. 16B and 17B are cross-sectional views taken along line I-F of FIGS. 16A and 17A, respectively, according to aspects of one or more embodiments of the present disclosure.

FIGS. 16C and 17C are cross-sectional views taken along line II-IF of FIGS. 16A and 17A, respectively, according to aspects of one or more embodiments of the present disclosure.

FIGS. 16D and 17D are cross-sectional views taken along line III-III' of FIGS. 16A and 17A, respectively, according to aspects of one or more embodiments of the present disclosure.

FIGS. 16E and 17E are cross-sectional view taken along line IV-IV' of FIGS. 16A and 17A, respectively, according to aspects of one or more embodiments of the present disclosure.

DETAILED DESCRIPTION

Figure 1:
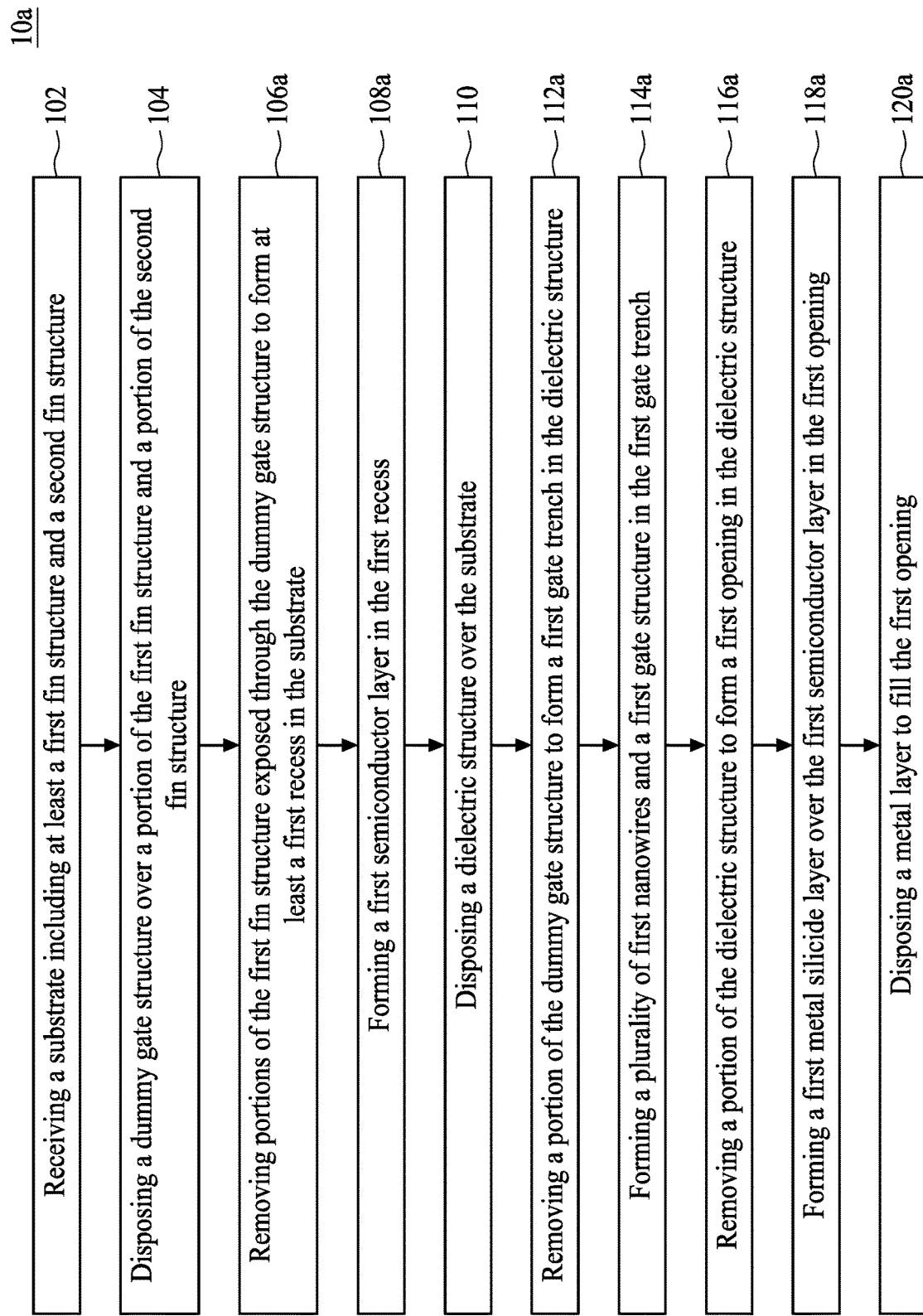
FIG. 1 shows a flow chart representing a method for forming a multi-gate semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

GAA transistor structures may include nanowire structures, which are a promising candidate for logic device applications in future technologies. While downscaling device pitch, external resistance of source/drain and metal contact becomes a dominant factor in determining the device performance, more of a factor than channel resistance. As circuit density and device density increase, metal contact dimensions have to be decreased accordingly in order to minimize the ratio of contact area to the total chip area. Contact resistance is normally inverse to contact area. That is, a smaller contact area will correspond to a greater contact resistance. Further, within a limited contact area, resistance of a metal contact will be increased not only due to a smaller metal volume in the limited contact area, but also due to the inferior current spreading in metal. This makes contact resistance a significant and sometimes dominant factor in very large scale integration (VLSI) metal system performance.

It is therefore concluded that electrical contacts and associated contact resistance, which are required to conduct both power and signals throughout the integrated circuitry, are important in the manufacturing and subsequent operation of integrated circuit devices.

It should be noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. One of ordinary skill may recognize other examples of semiconductor devices that may benefit from aspects of the present disclosure.

FIG. 1 is a flow chart representing a method for forming a multi-gate semiconductor structure 10a according to aspects of the present disclosure. The method 10a includes an operation 102, receiving a substrate including at least a first fin structure and a second fin structure. The method 10a further includes an operation 104, disposing a dummy gate structure over a portion of the first fin structure and a portion of the second fin structure. The method 10a further includes an operation 106a, removing portions of the first fin structure exposed through the dummy gate structure to form at least a first recess in the substrate. The method 10a further includes an operation 108a, forming a first semiconductor layer in the first recess. The method 10a further includes an operation 110, disposing a dielectric structure over the substrate. The method 10a further includes an operation 112a, removing a portion of the dummy gate structure to form a first gate trench in the dielectric structure. The method 10a further includes an operation 114a, forming a plurality of first nanowires and a first gate structure in the first gate trench. The method 10a further includes an operation 116a, removing a portion of the dielectric structure to form a first opening in the dielectric structure. The method 10a further includes an operation 118a, forming a first metal silicide layer over the first semiconductor layer in the first opening. The method 10a further includes an operation 120a, disposing a metal layer to fill the first opening. The method 10a will be further described according to one or more embodiments. It should be noted that the operations of the method for forming the multi-gate semiconductor device 10a may be rearranged or otherwise modified within the scope of the various aspects. It should be further noted that additional processes may be provided before, during, and after the method 10a, and that some other processes may be only briefly described herein. Thus other implementations are possible within the scope of the various aspects described herein.

Figure 2:
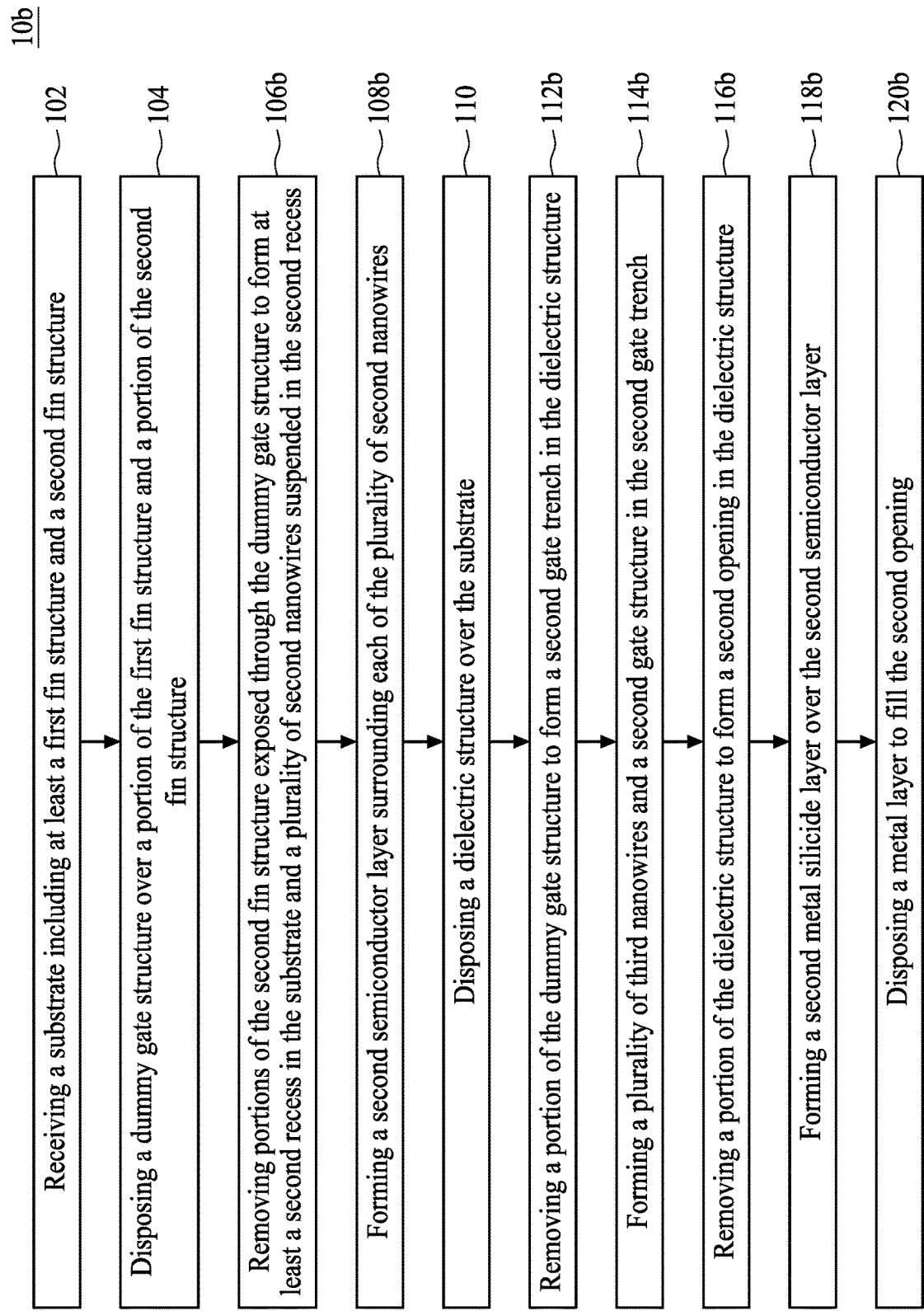
FIG. 2 shows a flow chart representing a method for forming a multi-gate semiconductor structure according to aspects of the present disclosure.

FIG. 2 is a flow chart representing a method for forming a multi-gate semiconductor structure 10b according to aspects of the present disclosure. In some embodiments, the method 10b and the method 10a share similar operations, but the disclosure is not limited thereto. The method 10b includes the operation 102, receiving a substrate including at least a first fin structure and a second fin structure. The method 10b further includes the operation 104, disposing a dummy gate structure over a portion of the first fin structure and a portion of the second fin structure. The method 10b further includes an operation 106b, removing portions of the second fin structure exposed through the dummy gate structure to form at least a second recess in the substrate and a plurality of nanowires suspended in the second recess. The method 10b further includes an operation 108b, forming a second semiconductor layer surrounding each of the plurality of second nanowires. The method 10b further includes the operation 110, disposing a dielectric structure over the substrate. The method 10b further includes an operation 112b, removing a portion of the dummy gate structure to form a second gate trench in the dielectric structure. The method 10b further includes an operation 114b, forming a plurality of third nanowires and a second gate structure in the second gate trench. The method 10b further includes an operation 116b, removing a portion of the dielectric structure to form a second opening in the dielectric structure. The method 10b further includes an operation 118b, forming a second metal silicide layer over the second semiconductor layer. The method 10b further includes an operation 120b, disposing a metal layer to fill the second opening. The method 10b will be further described according to one or more embodiments. It should be noted that the operations of the method for forming the multi-gate semiconductor device 10b may be rearranged or otherwise modified within the scope of the various aspects. Further, the method 10a and the method 10b can be integrated, and thus similar operations can be performed simultaneously. In some embodiments, operations 116b and 118b of the method 10b are performed after operations 116a and 118a of the method 10a. In other embodiments, operations 116a and 118a of the method 10a and operations 116b and 118b of the method 10b are simultaneously performed. It should be further noted that additional processes may be provided before, during, and after the method 10b, and that some other processes may be only briefly described herein. Thus other implementations are possible within the scope of the various aspects described herein.

FIGS. 3A, 4A, 5A, 6A, 7A, 8A, 9A, 10A, 11A, 12A, 13A, 14A, and 15A are drawings illustrating a multi-gate semiconductor device 300 at various fabrication stages constructed according to aspects of one or more embodiments the present disclosure. FIGS. 3B, 4B, 5B, 6B, 7B, 8B, 9B, 10B, 11B, 12B, 13B, 14B, and 15B are cross-sectional views taken along line I-I' of FIGS. 3A, 4A, 5A, 6A, 7A, 8A, 9A, 10A, 11A, 12A, 13A, 14A, and 15A, respectively, according to aspects of one or more embodiments of the present disclosure, FIGS. 3C, 4C, 5C, 6C, 7C, 8C, 9C, 10C, 11C, 12C, 13C, 14C, and 15C are cross-sectional views taken along line II-IT of FIGS. 3A, 4A, 5A, 6A, 7A, 8A, 9A, 10A, 11A, 12A, 13A, 14A, and 15A, respectively, according to aspects of one or more embodiments of the present disclosure, FIGS. 3D, 4D, 5D, 6D, 7D, 8D, 9D, 10D, 11D, 12D, 13D, 14D, and 15D are cross-sectional views taken along line III-III' of FIGS. 3A, 4A, 5A, 6A, 7A, 8A, 9A, 10A, 11A, 12A, 13A, 14A, and 15A, respectively, according to aspects of one or more embodiments of the present disclosure, and FIGS. 4E, 5E, 6E, 7E, 8E, 9E, 10E, 11E, 12E, 13E, 14E, and 15E are cross-sectional views taken along line IV-IV' of FIGS. 4A, 5A, 6A, 7A, 8A, 9A, 10A, 11A, 12A, 13A, 14A, and 15A, respectively, according to aspects of one or more embodiments of the present disclosure. As shown in FIGS. 3A to 3D, a substrate 202 is provided. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions 202a and 202b designed for different device types (e.g., n-type field effect transistors (NFET), or p-type field effect transistors (PFET)), as shown in FIGS. 3C and 3D. The suitable doping may include ion implantation of dopants and/or diffusion processes. The substrate 202 typically has isolation features (e.g., shallow trench isolation (STI) features) 204 interposing the regions 202a and 202b providing different device types. Further, the substrate 202 may optionally include an epitaxial layer (epi-layer), may be strained for performance enhancement, may include an SOI structure, and/or may have other suitable enhancement features. A stack including semiconductor layers is formed over the substrate 202. In some embodiments, a strain relaxed buffer (SRB) layer (not shown) can be formed over the substrate 202. The SRB layer may be different in composition from the substrate 202 in order to create lattice strain at the interface with the substrate 202. For example, in some embodiments, the substrate 202 includes silicon and is substantially free of germanium while the SRB layer includes SiGe.

Still referring to FIGS. 3A to 3D, a stack including semiconductor layers is formed over the substrate 202. In embodiments that include an SRB layer disposed on the substrate 202, the stack of semiconductor layers may be disposed on the SRB layer. The stack of semiconductor layers may include alternating layers of different compositions. For example, in some embodiments, the stack includes semiconductor layers 206 of a first composition alternating with semiconductor layers 208 of a second composition. By way of example, growth of the layers of the stack may be performed by a molecular beam epitaxy (MBE) process, a metalorganic chemical vapor deposition (MOCVD) process, and/or other suitable epitaxial growth processes. Although five semiconductor layers 206 and five semiconductor layers 208 are shown, it should be understood that the stack may include any number of layers of any suitable composition with various examples including between 2 and 10 semiconductor layers 206 and between 2 and 10 semiconductor layers 208. As explained below, the different compositions of the layers in the stack (e.g., semiconductor layers 206 and semiconductor layers 208) may be used to selectively process some of the layers. Accordingly, the compositions may have different oxidation rates, etchant sensitivity, and/or other differing properties. The semiconductor layers 206 and 208 may have thicknesses chosen based on device performance considerations. In some embodiments, the semiconductor layers 206 are substantially uniform in thickness, and the semiconductor layers 208 are substantially uniform in thickness. In some embodiments, the thickness of the semiconductor layers 206 can be less than the thickness of the semiconductor layers 208, but the disclosure is not limited thereto. For example but not limited thereto, the thickness of the semiconductor layers 206 can be approximately 6 nanometers (nm), and the thickness of the semiconductor layers 208 can be approximately 8 nm.

In some embodiments, the semiconductor layers 208 may include a first semiconductor material such as Si while the semiconductor layers 206 may include the first semiconductor material and a second semiconductor material with a lattice constant greater than a lattice constant of the first semiconductor material. For example, the semiconductor layers 206 may include SiGe, but the disclosure is not limited thereto. Additionally, Ge concentration in the semiconductor layers 206 can be less than or equal to approximately 50%, but the disclosure is not limited thereto. In other embodiments, the semiconductor layers 206 may include other materials such as a compound semiconductor such as SiC, gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 206 and 208 may be undoped or substantially dopant-free, where, for example, no doping is performed during the epitaxial growth process. Alternatively, the semiconductor layers 206 and 208 may be doped. For example, the semiconductor layers 206 or 208 may be doped with a p-type dopant such as boron (B), aluminum (Al), In, and Ga for forming a p-type channel, or an n-type dopant such as P, As, Sb, for forming an n-type channel.

Still referring to FIGS. 3A to 3D, at least a first fin structure 210a and at least a second fin structure 210b are formed over the substrate 202 from the stack of semiconductor layers 206/208. The first fin structure 210a and the second fin structure 210b may be fabricated using suitable operations including photolithography and etch operations. In some embodiments, forming the first and second fin structures 210a and 210b may further include a trim process to decrease the width and/or the height of the first and second fin structures 210a and 210b. The trim process may include wet or dry etching processes. The height and width of the first and second fin structures 210a and 210b may be chosen based on device performance considerations. Further, the first and second fin structures 210a and 210b can extend along a first direction D1 as shown in FIGS. 3A to 3D. Accordingly, the substrate 202 including the at least one first fin structure 210a and at least one second fin structure 210b is received according to operation 102 of the method 10a and the method 10b.

Referring to FIGS. 4A to 4E, in some embodiments, a liner 209 can be formed over the first fin structure 210a, the second fin structure 210b and the substrate 202. Next, a dummy gate structure 212 is disposed over a portion of the first fin structure 210a and a portion of the second fin structure 210b according to operation 104 of the method 10a and the method 10b. The dummy gate structure 212 may be replaced at a later processing stage by a high-K dielectric layer (HK) and metal gate electrode (MG) as discussed below. In some embodiments, the dummy gate structure 212 is formed over the substrate 202 and extends along a second direction D2, which is not parallel with the first direction D1. Additionally, the first direction D1 and the second direction D2 are in the same plane. As shown in FIGS. 4A to 4D, the portion of the first fin structure 210a underlying the dummy gate structure 212 may be referred to as the channel region, and the portion of the second fin structure 210b underlying the dummy gate structure 212 may be referred to as the channel region. The dummy gate structure 212 may also define a source/drain region of the first fin structure 210a, for example, portions of the first fin structure 210a adjacent to and on opposing sides of the channel region. Similarly, the dummy gate structure 212 may also define a source/drain region of the second fin structure 210b, for example, portions of the second fin structure 210b adjacent to and on opposing sides of the channel region. In some embodiments, the dummy gate structure 212 can include at least a polysilicon layer and a patterned hard mask for defining the dummy gate structure.

Still referring to FIGS. 4A to 4E, a spacer 214 can be disposed over sidewalls of the dummy gate structure 212, and portions of the first and second fin structures 210a and 210b are exposed through the dummy gate structure 212 and the spacer 214. In some embodiments, the spacer 214 includes insulating materials. As shown in FIGS. 4A, 4C and 4D, the sidewalls of the dummy gate structure 212 are covered by the spacer 214. In some embodiments, portions of the liner 209 can be removed during or after the forming of the spacer 214, and thus portions of the first and second fin structures 210a and 210b are exposed as shown in FIGS. 4C to 4E.

Figures 5C, 5D:
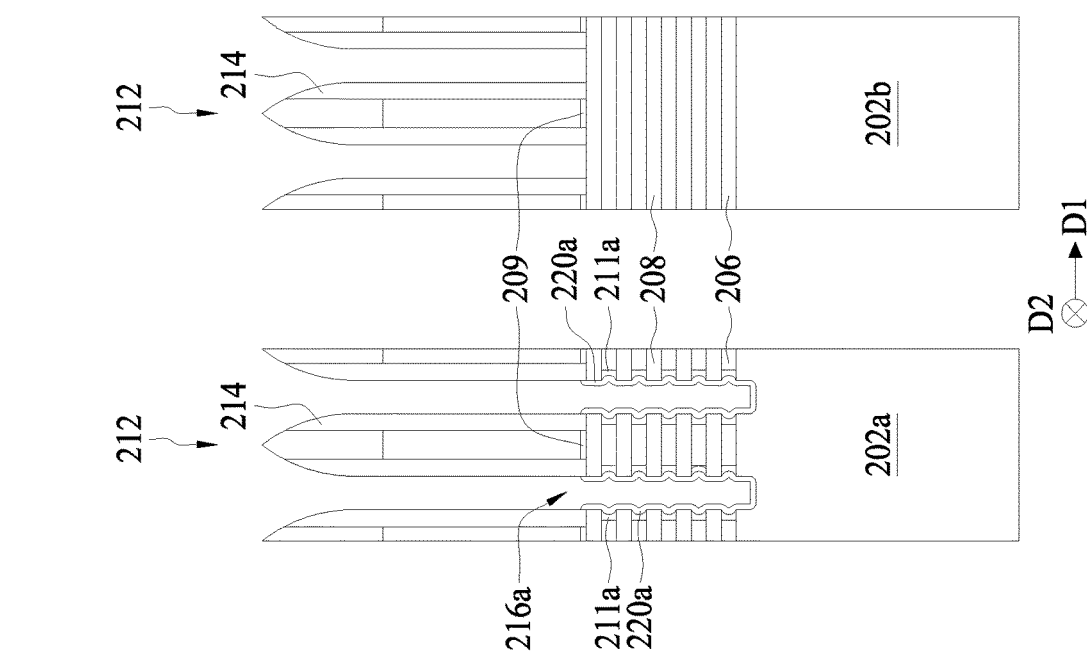
Figures 5B, 5E:
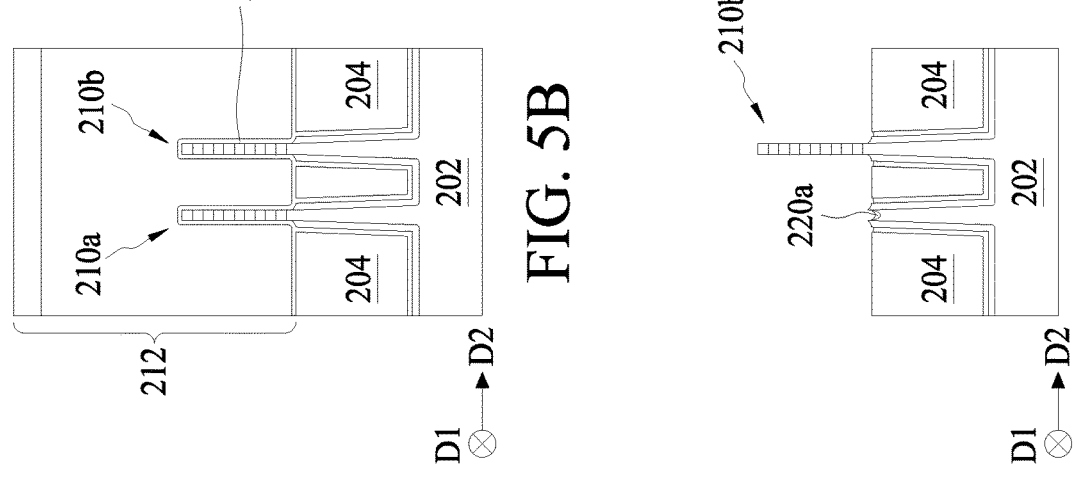
Figure 5A:
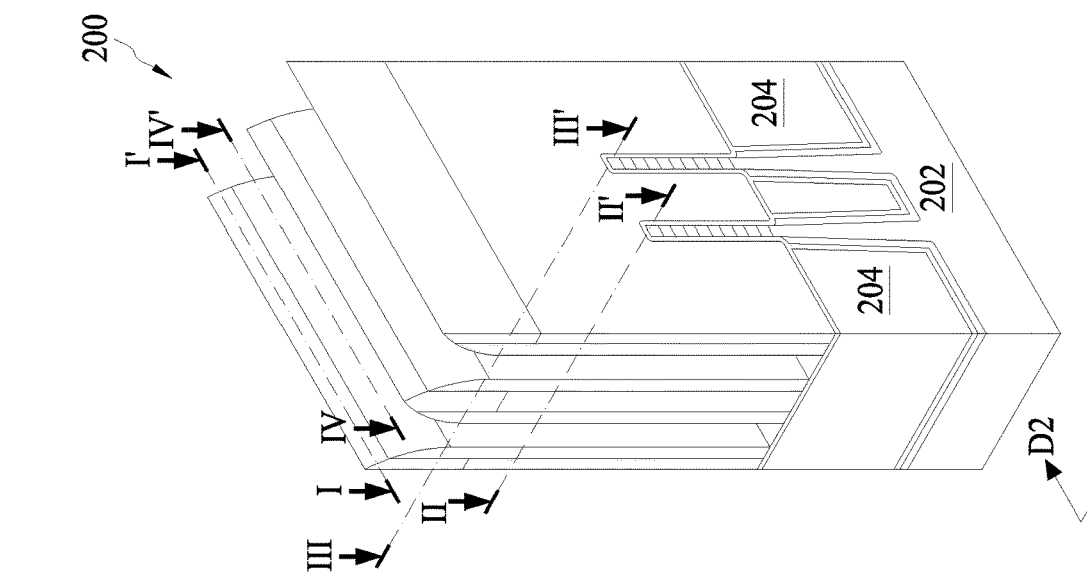

Referring to FIGS. 5A to 5E, next, the portions of the first fin structure 210a exposed through the dummy gate structure 212 and the spacer 214 are removed according to operation 106a. In some embodiments, portions of the semiconductor layers 206 and portions of the semiconductor layers 208 exposed through the dummy gate structure 212 and the spacer 214 are removed, thereby forming at least a first recess 216a in the substrate 202 as shown in FIG. 5C. In some embodiments, a patterned protecting layer (not shown) is formed over the second fin structure 210b or deposited over the region 202b. Thus the second fin structure 210b is protected and impervious to the formation of the first recess 216a. The semiconductor layers 206, and the semiconductor layers 208 are exposed through sidewalls of the first recess 216a and the substrate 202 is exposed through a bottom of the first recess 216a. In some embodiments, a portion of each of the exposed semiconductor layers 206 is removed and thus a plurality of notches (not shown) are formed. In some embodiments, an insulating layer (not shown) is formed over the substrate 202 and a suitable etching operation is then performed. Thus, a plurality of inner spacers 211a are formed in the notches as shown in FIG. 5C. Consequently, the semiconductor layers 208 and the inner spacers 211a are exposed. In other words, the semiconductor layers 206 are enclosed by the semiconductor layers 208 and the inner spacers 211a. In some embodiments, the inner spacers 211a include one or more insulating materials such as SiN, SiO, SiC, SiOC, SiOCN, other materials, or a combination thereof, but the disclosure is not limited thereto.

Still referring to FIGS. 5A to 5E, a first semiconductor layer 220a is formed in the first recess 216a according to operation 108a of the method 10a. In some embodiments, the first semiconductor layer 220a is a doped epitaxial semiconductor layer. In some embodiments, the first semiconductor layer 220a is a phosphorus-doped silicon (SiP) epitaxial layer, but the disclosure is not limited thereto. Additionally, the first semiconductor layer 220a covers the semiconductor layers 208, the inner spacers 211a and the bottom of the first recess 216a. Subsequently, the patterned protecting layer is removed from the substrate 202 after the forming of the first semiconductor layer 220a as shown in FIGS. 5A to 5E. In some embodiments, a thickness of the first semiconductor layer 220a is between approximately 10 nm and approximately 20 nm, but the disclosure is not limited thereto.

Referring to FIGS. 6A to 6E, next, portions of the second fin structure 210b exposed through the dummy gate structure 212 and the spacer 214 are removed according to operation 106b of the method 10b. In some embodiments, portions of the semiconductor layers 208 are removed, thereby forming at least a second recess 216b in the substrate 202 according to operation 106b. Significantly, a plurality of nanowires 230, which previously comprised the semiconductor layers 206, are formed in the second recess 216b according to operation 106b, as shown in FIGS. 6D and 6E. In some embodiments, a patterned protecting layer (not shown) is formed to fill the first recess 216a or deposited over the region 202a, and thus the first semiconductor layer 220a is protected and impervious to the formation of the second recess 216b and the plurality of nanowires 230. As shown in FIGS. 6D and 6E, the plurality of nanowires 230 are suspended in and exposed through the second recess 216b, the semiconductor layers 208 are exposed through sidewalls of the second recess 216b, and the substrate 202 is exposed through a bottom of the second recess 216b.

Referring to FIGS. 7A to 7E, a portion of the exposed semiconductor layers 208 is then removed and thus a plurality of notches (not shown) are formed. In some embodiments, an insulating layer (not shown) is formed over the substrate 202 and a suitable etching operation is subsequently performed. Thus, a plurality of inner spacers 211b are formed in the notches and over the substrate 202, as shown in FIG. 7D. In other words, the semiconductor layers 208 are enclosed by the semiconductor layers 206 and the inner spacers 211b. In some embodiments, the inner spacers 211b include one or more insulating materials such as SiN, SiO, SiC, SiOC, SiOCN, other materials, or a combination thereof, but the disclosure is not limited thereto.

Still referring to FIGS. 7A to 7E, a second semiconductor layer 220b is formed in the second recess 216b according to operation 108b of the method 10b. The second semiconductor layer 220b is formed to surround each of the nanowires 230, as shown in FIG. 7E. In some embodiments, the second semiconductor layer 220b includes the first semiconductor material and the second semiconductor material. For example but not limited thereto, the second semiconductor layer 220b can include SiGe, and a Ge concentration of the second semiconductor layer 220b is greater than the Ge concentration of the plurality of nanowires 230, which previously comprised the semiconductor layers 206. In some embodiments, the Ge concentration of the second semiconductor layer 220b is greater than 50%, but the disclosure is not limited thereto. In some embodiments, the Ge concentration of the second semiconductor layer 220b is between approximately 50% and approximately 70%, but the disclosure is not limited thereto. In some embodiments, the second semiconductor layer 220b is a doped epitaxial semiconductor layer. For example but not limited thereto, the second semiconductor layer 220b can be a boron-doped silicon germanium (SiGeB) epitaxial layer. Further, the patterned protecting layer is removed from the substrate 202 after the forming of the second semiconductor layer 220b. In some embodiments, the method 10a and the method 10b are integrated such that operations 106b and 108b of the method 10b are performed after operations 106a and 108a of the method 10a. However, operations 106b and 108b of the method 10b can performed before operations 106a and 108a of the method 10a in other embodiments.

Referring to FIGS. 8A to 8E, a dielectric structure 240 is disposed over the substrate 202 according to operation 110 of the method 10a and the method 10b. The dielectric structure 240 fills the first recess 216a and the second recess 216b. In some embodiments, the dielectric structure 240 can include an etch-stop layer (e.g., a contact etch stop layer (CESL)) 242 and various dielectric layers (e.g., an interlayer dielectric (ILD) layer) 244 formed on the substrate 202 after the forming of the second semiconductor layer 220b. In some embodiments, the CESL 242 includes a SiN layer, a SiCN layer, a SiON layer, and/or other materials known in the art. In some embodiments, the ILD layer 244 includes materials such as tetraethylorthosilicate (TEOS) oxide, un-doped silicate glass, or doped silicon oxide such as boro-phosphosilicate glass (BPSG), fused silica glass (FSG), phosphosilicate glass (PSG), boron doped silicon glass (BSG), and/or other suitable dielectric materials. In some embodiments, after the CESL 242 and the ILD layer 244 are deposited, a planarization process, such as a chemical mechanical planarization (CMP) operation, may be performed to form the dielectric structure 240 and to expose a top surface of the dummy gate structure 212 as shown in FIGS. 8A to 8D. In some embodiments, the planarization is performed to expose at least a top surface of the polysilicon layer of the dummy gate structure 212.

Referring to FIGS. 9A to 9E, a portion of the dummy gate structure 212 is subsequently removed to form a first gate trench 218a in the dielectric structure 240 according to operation 112a. In some embodiments, a patterned protecting layer (not shown) is formed over the region 202b, and thus elements in the region 202b are protected and impervious to the formation of the first gate trench 218a. As shown in FIG. 9C, the spacer 214 is exposed through sidewalls of the first gate trench 218a, and the first fin structure 210a is exposed through the first gate trench 218a. Subsequently, the liner layer 209 disposed over the first fin structure 209 is removed, and the semiconductor layers 206 are then removed. Accordingly, a plurality of nanowires 232, which previously comprised the semiconductor layers 208, are formed in the first gate trench 218a according to operation 114a of the method 10a, as shown in FIGS. 9B and 9C. Further, the plurality of nanowires 232 serving as channel regions are suspended in the first gate trench 218a. In some embodiments, the nanowires 232 can be slightly etched to obtain various desirable dimensions and shapes, and the various desired dimensions and shapes may be chosen based on device performance considerations. As shown in FIG. 9C, the plurality of nanowires 232 and the inner spacers 211a are therefore exposed through the first gate trench 218a. The patterned protecting layer is then removed.

Referring to FIGS. 10A to 10E, another portion of the dummy gate structure 212 is then removed to form a second gate trench 218b in the dielectric structure 240 according to operation 112b of the method 10b. In some embodiments, another patterned protecting layer (not shown) is formed over the region 202a, and thus elements in the region 202a are protected and impervious to the formation of the second gate trench 218b. As shown in FIG. 10C, the spacer 214 is exposed through sidewalls of the second gate trench 218b, and the second fin structure 210b is exposed through the second gate trench 218b. Subsequently, the liner layer 209 disposed over the second fin structure 210b is removed, and the semiconductor layers 208 are removed. Accordingly, a plurality of nanowires 234, which previously comprised the semiconductor layers 206, are formed in the second gate trench 218b according to operation 114b of the method 10b, as shown in FIGS. 10B and 10D. Further, the plurality of nanowires 234 serving as channel regions are suspended in the second gate trench 218b. In some embodiments, the nanowires 234 can be slightly etched to obtain various desirable dimensions and shapes, and the various desired dimensions and shapes may be chosen based on device performance considerations. As shown in FIG. 10D, the plurality of nanowires 234 and the inner spacers 211b are therefore exposed through the second gate trench 218b. The patterned protecting layer is then removed. Additionally, the plurality of nanowires 230 and the plurality of nanowires 234, both of which previously comprised the semiconductor layers 206, include the same materials. Further, each of the nanowires 234 is coupled to each of the nanowires 230, as shown in FIG. 10D. In other words, each of the nanowires 234 is coupled to a corresponding nanowire 230. In some embodiments, it is referred that the nanowires 230 and nanowires 234 are the same nanowires, as shown in FIG. 10.

Figures 11C, 11D:
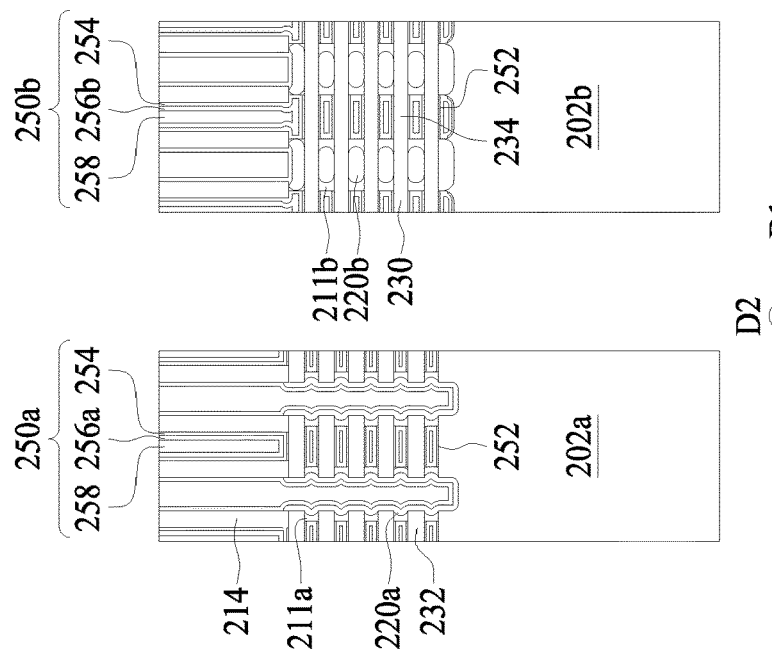
Figure 11B:
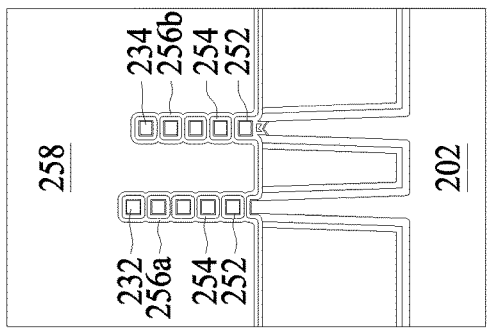
Figure 11E:
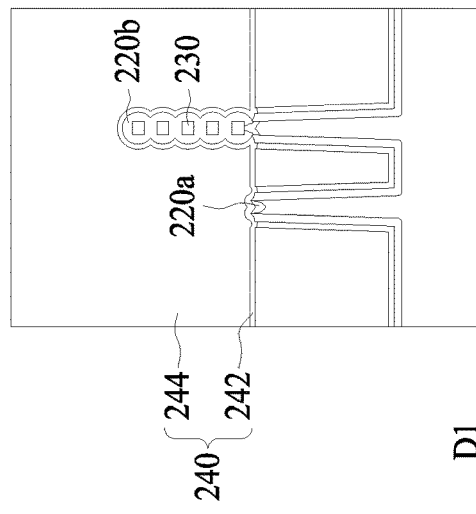
Figure 11A:
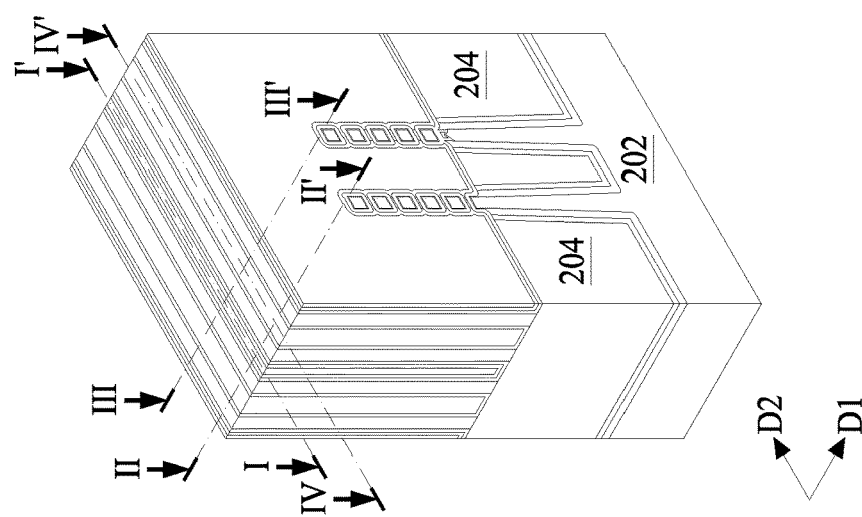

Referring to FIGS. 11A to 11E, an interfacial layer (IL) 252 is formed to surround each of the nanowires 232 exposed in the first gate trench 218a and each of the nanowires 234 exposed in the second gate trench 218b, as shown in FIG. 11B. In some embodiments, the IL 252 may include an oxide-containing material such as SiO or SiON. After the forming of the IL 252, a gate dielectric layer 254 is formed over the IL 252. As shown in FIG. 11B, the gate dielectric layer 254 surrounds each of the nanowires 232 and each of the nanowires 234. In some embodiments, the gate dielectric layer 254 includes a high-k dielectric material having a high dielectric constant, for example, a dielectric constant greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof.

Still referring to FIGS. 11A to 11E, after the forming of the gate dielectric layer 254, a first gate conductive layer 256a is disposed in the first gate trench 218a according to operation 114a of the method 10a, and a second gate conductive layer 256b is disposed in the second gate trench 218b according to operation 114b of the method 10b. The first and second gate conductive layers 256a and 256b are formed on the gate dielectric layer 254. In some embodiments, the first gate conductive layer 256a is formed for an n-channel FET, and the second gate conductive layer 256b is formed for a p-channel FET. In some embodiments, the first gate conductive layer 256a can include at least a barrier metal layer (not shown) and a first work function layer, and the second gate conductive layer 256b can include at least a barrier metal layer (not shown) and a second work function metal layer. The barrier metal layer can include, for example but not limited to, TiN. The first work function metal layer, which provides proper work function to the n-channel FET, includes one or more of TaN, TaAlC, TiN, TiC, Co, TiAl, HfTi, TiSi and TaSi, but the disclosure is not limited thereto. The second work function metal layer, which provides proper work function to the p-channel FET, includes one or more of TiAlC, Al, TiAl, TaN, TaAlC, TiN, TiC and Co, but the disclosure is not limited thereto. Next, a gap-filling metal layer 258 is formed to fill the first gate trench 218a and the second gate trench 218b. The gap-filling metal layer 258 can include conductive material, such as Al, Cu, AlCu, or W, but is not limited to the above-mentioned materials. Accordingly, a first gate structure 250a is formed in the first gate trench 218a, and a second gate structure 250b is formed in the second gate trench 218b, as shown in FIGS. 11A to 11E.

Referring to FIGS. 12A to 12E, a patterned protecting layer 260 is then formed over the dielectric structure 240 and the first and second gate structures 250a and 250b. The patterned protecting layer 260 serves as an etching mask for the subsequent operations. Next, a portion of the dielectric layer 240 is removed through the patterned protecting layer 260, and thus at least a first opening 262a is formed in the dielectric structure 240 according to operation 116a of the method 10a. Further, the first semiconductor layer 220a is exposed in a lower portion of the first opening 262a while the dielectric structure 240 and the spacers 214 are exposed in an upper portion of the first opening 262a, as shown in FIGS. 12C and 12E.

Referring to FIGS. 13A to 13E, a first metal silicide layer 270a is then formed over the first semiconductor layer 220a according to operation 118a of the method 10a. The first metal silicide layer 270a includes the first semiconductor material and a first metal material. In some embodiments, the first metal silicide layer 270a can be formed by depositing a metallic layer such as a TiN layer over the first semiconductor layer 220a. Next, a thermal operation is performed. Consequently, a portion of the first semiconductor layer 220a reacts with the metallic layer, and the first metal silicide layer 270a is formed. Therefore, the first metal silicide layer 270a can include $TiSi_x$, but the disclosure is not limited thereto. A thickness of the first semiconductor layer 220a is reduced to between approximately 5 nm and approximately 15 nm, but the disclosure is not limited thereto. Additionally, since the first metal silicide layer 270a is formed only over the first semiconductor layer 220a, the first metal silicide layer 270a is exposed in the lower portion of the first opening 262a, as shown in FIG. 13C. In some embodiments, a glue layer 272 including TiN can be formed over the first metal silicide layer 270a and sidewalls of the upper portion of the first opening 262a. However, in other embodiments, the glue layer 272 can be omitted.

Referring to FIGS. 14A to 14E, a portion of the dielectric layer 240 is further removed to form at least a second opening 262b in the dielectric structure 240 according to operation 116b of the method 10b. Further, the second semiconductor layer 220b is exposed in a lower portion of the second opening 262b while the dielectric structure 240 and the spacers 214 are exposed in an upper portion of the second opening 262b, as shown in FIGS. 14D and 14E.

Figure 15E:
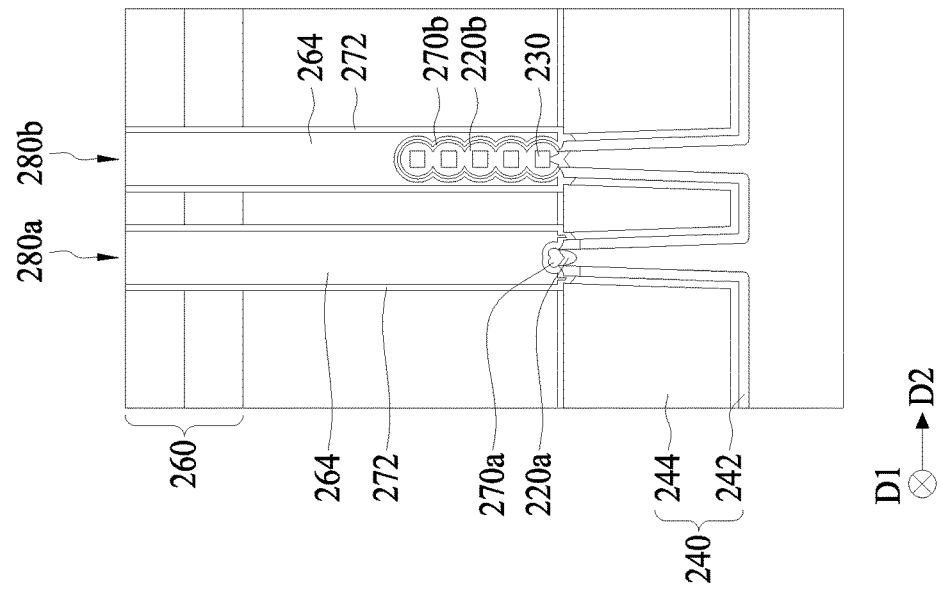
Figure 15B:
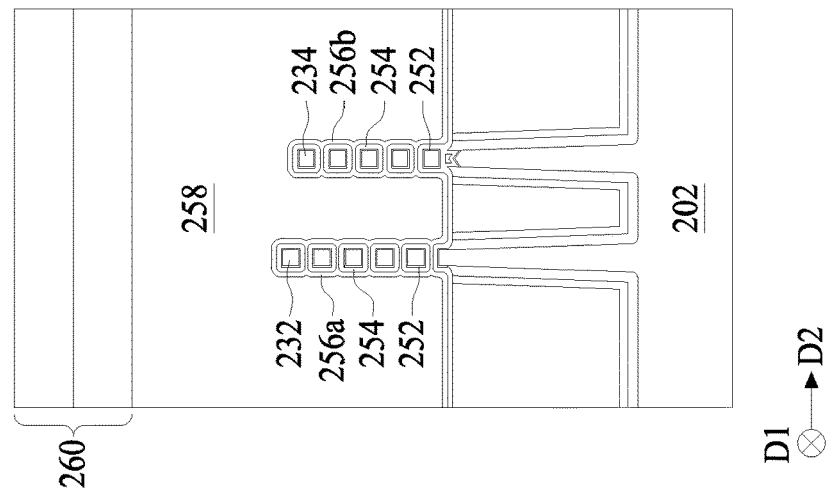
Figure 15A:
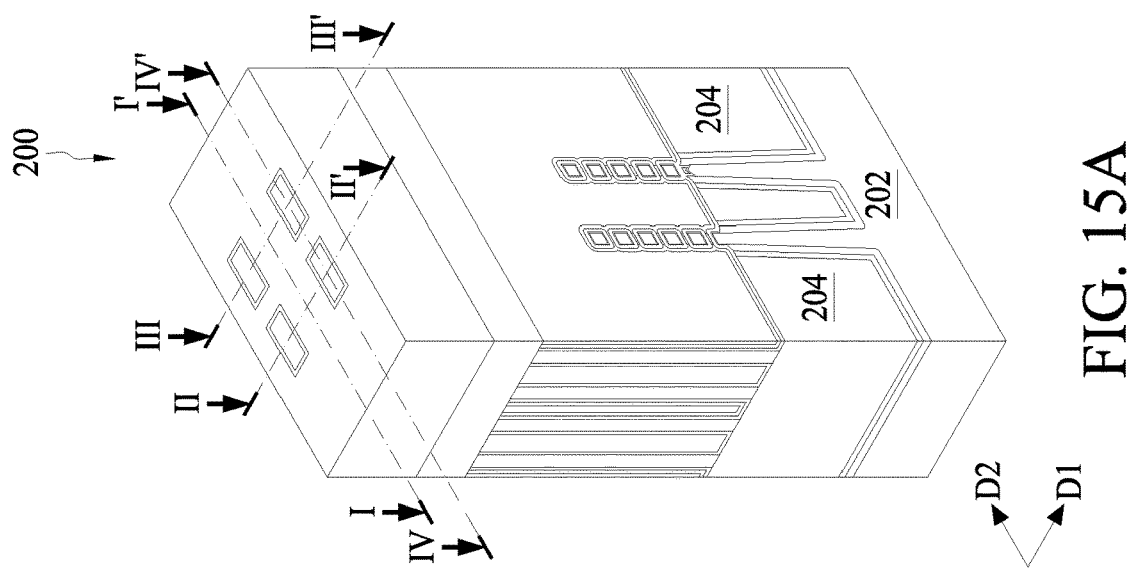

Referring to FIGS. 15A to 15E, a second metal silicide layer 270b is then formed over the second semiconductor layer 220b according to operation 118b of the method 10b. The second metal silicide layer 270b includes the first semiconductor material, the second semiconductor material, and a second metal material. In some embodiments, the second metal material of the second metal silicide layer 270b is different from the first metal material of the first metal silicide layer 270a. In some embodiments, the first metal silicide layer 270a includes $TiSi_x$, and the second metal silicide layer 270b includes $NiSiGe_x$, but the disclosure is not limited thereto. In some embodiment, a Ni layer is formed over the second semiconductor layer 220b, which is exposed in the lower portion of the second opening 262b, by suitable operation, such as chemical vapor deposition (CVD). Subsequently, anneal is performed such that Ni and SiGe are reacted and thus $NiSiGe_x$ silicide layer 270b is formed. The superfluous Ni layer is then removed. Additionally, since the second metal silicide layer 270b is formed only over the second semiconductor layer 220b, the second metal silicide layer 270b is exposed in the lower portion of the second opening 262b, as shown in FIG. 15E. In some embodiments, a glue layer 272 including TiN can be formed over the second metal silicide layer 270b and sidewalls of the upper portion of the second opening 262b. However, in other embodiments, the glue layer 272 can be omitted. Additionally, because thermal budget of Ni is lower than that of Ti, the first metal silicide layer 270a is formed before forming the second opening 262b and the second metal silicide layer 270b, but the disclosure is not limited thereto.

Figure 15D:
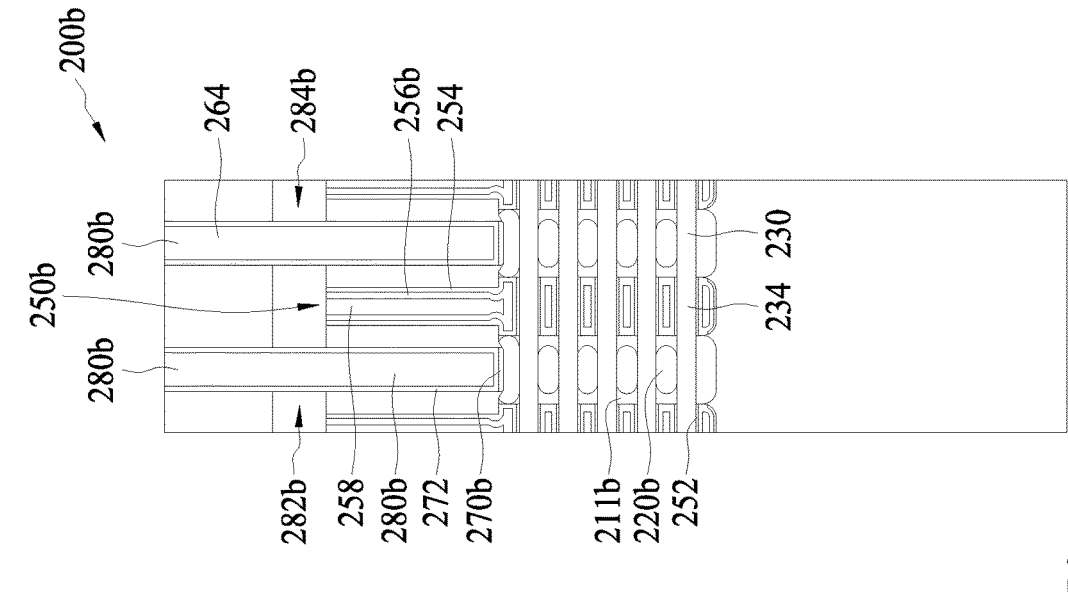
Figure 15C:
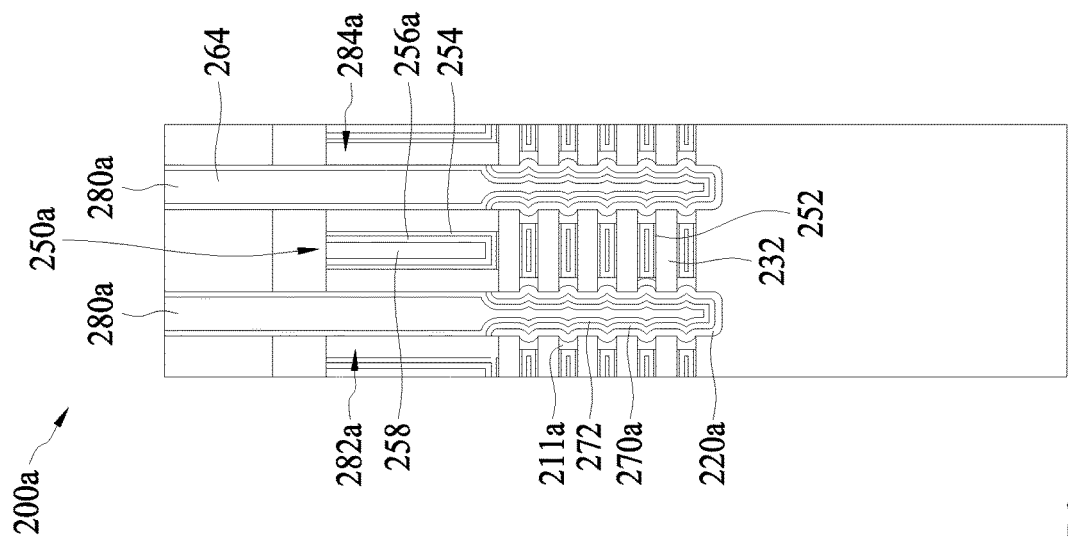

Still referring to FIGS. 15A to 15E, a metal layer 264 is next disposed to fill the first opening 262a and the second opening 262b according to operation 120a of the method 10a and operation 120b of the method 10b. In some embodiments, the metal layer 264 includes low-resistivity metal material, such as tungsten (W), but the disclosure is not limited thereto. Accordingly, at least a first conductor, such as a first metal portion 280a, is formed in the first opening 262a and a second conductor, such as a second metal portion 280b, is formed in the second opening 262b. As shown in FIGS. 15C and 15D, a bottom and sidewalls of a lower portion of the first metal portion 280a in the first opening 262a are surrounded by the first silicide layer 270a while sidewalls of an upper portion of the first metal portion 280a in the first openings 262a are surrounded by the spacer 214 and patterned protecting layer 260. Further, the bottom of the second metal portion 280b in the first opening 262a is lower than the plurality of nanowires 232, as shown in FIG. 15C. In contrast to the first metal portion 280a, a lower portion of the second metal portion 280b in the second openings 262b surrounds the second metal silicide layer 270b, as shown in FIGS. 15D and 15E.

Accordingly, a multi-gate semiconductor device 200a is obtained. As shown in FIG. 15C, the multi-gate semiconductor device 200a includes the plurality of nanowires 232, the first gate structure 250a over the plurality of nanowires 232, and source/drain structures 282a and 284a at two ends of each nanowire 232. The source/drain structures 282a and 284a include the first semiconductor layer 220a, the first metal portion 280a, and the first metal silicide layer 270a sandwiched between the first semiconductor layer 220a and the lower portion of the first metal portion 280a. Notably, a bottom surface of the first metal portion 280a is lower than the plurality of nanowires 232, as shown in FIG. 15C. Further, each of the first semiconductor layer 220a and the first metal silicide layer 270a substantially includes a U shape. Additionally, the first gate structure 250a can include a metal gate structure, but the disclosure is not limited thereto.

According to the multi-gate semiconductor device 200a, after the forming of the first semiconductor layer 220a and the first metal silicide layer 270a, there is still a space for forming the metal layer 264 in the first opening 262a, and thus the first metal portion 280a is obtained. Accordingly, the lower region of the first metal portion 280a can serve as a portion of the source/drain structures 282a and 284a while an upper region of the first metal portion 280a can serve as a contact plug for providing electrical connection between the source/drain structures 282a and 284a and other devices or circuits. More importantly, the first metal portion 280a can include low-resistivity metal material such as the aforementioned W, thereby reducing contact resistance.

In another embodiment, a multi-gate semiconductor device 200 is provided. The multi-gate semiconductor device 200 includes the multi-gate semiconductor structure 200a and a multi-gate semiconductor structure 200b. In some embodiments, the multi-gate semiconductor device 200 is a CMOS device, and the multi-gate semiconductor structure 200a is an n-channel FET and the multi-gate semiconductor structure 200b is a p-channel FET. As shown in FIGS. 15A to 15E, the multi-gate semiconductor device 200 includes the plurality of nanowires 232 serving as channel regions for the n-channel multi-gate semiconductor structure 200a and the plurality of nanowires 234 serving as channel regions for the p-channel multi-gate semiconductor structure 200b. The multi-gate semiconductor device 200 further includes the first gate structure 250a disposed over the plurality of nanowires 232, the second gate structure 250b disposed over the plurality of nanowires 234, the first source/drain structures 282a and 284a disposed at two ends of each nanowire 232, and second source/drain structures 282b and 284b disposed at two ends of each nanowire 234. It should be noted that the first source/drain structures 282a and 284a include a conductor such as the first metal portion 280a, the first semiconductor layer 220a disposed around sidewalls and a bottom of the lower portion of the first metal portion 280a, and the first metal silicide layer 270a disposed between the lower portion of the first metal portion 280a and the first semiconductor layer 220a. The second source/drain structures 282b and 284b include the plurality of nanowires 230, the second metal silicide layer 270b disposed over the plurality of nanowires 230, and the second semiconductor layer 220b disposed between the second metal silicide layer 270b and the plurality of nanowires 230. Further, the nanowires 230 and the nanowires 234 are the same nanowires. It is referred that a portion of each nanowire surrounded by the second gate structure 250b serve as channel regions and are referred to as a first portion 234, while another portion of each nanowire adjacent to and on opposing sides of the channel region form a part of the second sour/drain structures 282b and 284b and are referred to as a second portion 230.

As mentioned above, the first metal silicide layer 270a and the second metal silicide layer 270b can include different semiconductor materials and different metal materials. In some embodiments, the first metal silicide layer 270a includes TiSi while the second metal silicide layer 270b includes NiSiGe. It should be noted that for the n-channel multi-gate semiconductor structure 200a, the contact resistance is reduced by forming the low-resistivity first metal portion 280a having the bottom surface lower than the plurality of nanowires 232. For the p-channel multi-gate semiconductor structure 200b, the contact resistance is reduced by forming the Ni-silicide layer, because Ni resistance is lower than Ti resistance. Accordingly, the contact resistance of the multi-gate semiconductor device 200 is reduced by the dual contact formation.

FIGS. 16A and 17A illustrate a multi-gate semiconductor device 200' at various fabrication stages constructed according to aspects of one or more embodiments of the present disclosure. FIG. 16B and FIG. 17B are cross-sectional views taken along line I-I' of FIGS. 16A and 17A, respectively, according to aspects of one or more embodiments of the present disclosure, FIGS. 16C and 17C are cross-sectional views taken along line II-IT of FIGS. 16A and 17A, respectively, according to aspects of one or more embodiments of the present disclosure, FIGS. 16D and 17D are cross-sectional views taken along line III-IIT of FIGS. 16A and 17A, respectively, according to aspects of one or more embodiments of the present disclosure, and FIGS. 16E and 17E are cross-sectional views taken along line IV-IV' of FIGS. 16A and 17A, respectively, according to aspects of one or more embodiments of the present disclosure. It should be noted that similar elements in FIGS. 3A to 15E and FIGS. 16A to 17E are designated by the same numerals. Further, similar elements in FIGS. 3A to 15E and FIGS. 16A to 17E can include similar materials and can be formed by similar steps; therefore such redundant details are omitted in the interest of brevity.

Please refer to FIGS. 16A to 16E. In some embodiments, operations 102, 104, 106a and 108a, 106b and 108b, 110, 112a and 114a, and 112b and 114b are performed, and operations 116a and 116b are simultaneously performed after the forming of the first and second gate structures 250a and 250b. Consequently, a first opening 262a and a second opening 262b are simultaneously formed in the dielectric layer 240. As shown in FIGS. 16A to 16E, the first semiconductor layer 220a is exposed in the first opening 262a and the second semiconductor layer 220b is exposed in the second opening 262b. In some embodiments, the first semiconductor layer 220a forms a bottom and sidewalls of a lower portion of the first opening 262a while the second semiconductor layer 220b protrudes from a bottom of the second opening 262b, as shown in FIGS. 16C and 16E.

Referring to FIGS. 17A to 17E, a first metal silicide layer 270a' is formed over the first semiconductor layer 220a and a second metal silicide layer 270b' is formed over the second semiconductor layer 220b according to operations 118a and 118b. Notably, the operations 118a and 118b are performed at the same time, and thus the first metal silicide layer 270a' and the second metal silicide layer 270b' are simultaneously formed. The first metal silicide layer 270a' includes the first semiconductor material and a first metal material, and the second metal silicide layer 270b' includes the first semiconductor material, the second semiconductor material and a second metal material. Notably, the first metal material and the second metal material are the same. In some embodiments, the first metal silicide layer 270a' includes TiSi, and the second metal silicide layer 270b' includes TiSiGe, but the disclosure is not limited thereto.

Still referring to FIGS. 17A to 17E, a glue layer such as a TiN layer is then formed over the first metal silicide layer 270a', the second metal silicide layer 270b', sidewalls of an upper portion of the first opening 262a, and sidewalls of an upper portion of the second opening 262b. However, in some embodiments, formation of the glue layer can be omitted. Subsequently, a metal layer 264 is formed to fill the first opening 262a and the second opening 262b according to operation 120.

Accordingly, a multi-gate semiconductor device 200' is provided. The multi-gate semiconductor device 200' includes the multi-gate semiconductor structure 200a' and a multi-gate semiconductor structure 200b'. In some embodiments, the multi-gate semiconductor device 200' is a CMOS device, the multi-gate semiconductor structure 200a' is an n-channel FET, and the multi-gate semiconductor structure 200b' is a p-channel FET. As shown in FIGS. 17A to 17E, the multi-gate semiconductor device 200' includes the plurality of nanowires 232 serving as channel regions for the n-channel multi-gate semiconductor structure 200a' and the plurality of nanowires 234 serving as channel regions for the p-channel multi-gate semiconductor structure 200b'. The multi-gate semiconductor device 200' further includes the first gate structure 250a disposed over the plurality of nanowires 232, the second gate structure 250b disposed over the plurality of nanowires 234, the first source/drain structures 282a and 284a disposed at two ends of each nanowire 232, and the second source/drain structures 282b and 284b disposed at two ends of each nanowire 234. It should be noted that the first source/drain structures 282a and 284a include the first conductor such as the first metal portion 280a, the first semiconductor layer 220a disposed around sidewalls and a bottom of the lower portion of the first metal portion 280a, and the first metal silicide layer 270a' disposed between the lower portion of the first metal portion 280a and the first semiconductor layer 220a. The second source/drain structures 282b and 284b include the plurality of nanowires 230, the second metal silicide layer 270b' disposed over the plurality of nanowires 230, and the second semiconductor layer 220b disposed between the second metal silicide layer 270b' and the plurality of nanowires 230. Further, the nanowires 230 and the nanowires 234 are the same nanowires. It is referred that a portion of each nanowire surrounded by the second gate structure 250b serve as channel regions and are referred to as a first portion 234, while another portion of each nanowire adjacent to and on opposing sides of the channel region form a part of the second sour/drain structures 282b and 284b and are referred to as a second portion 230.

As mentioned above, the first metal silicide layer 270a' and the second metal silicide layer 270b' can include different semiconductor materials but the same metal materials. In some embodiments, the first metal silicide layer 270a' includes TiSi while the second metal silicide layer 270b' includes TiSiGe. It should be noted that for the n-channel multi-gate semiconductor structure 200a', the contact resistance is reduced by forming the low-resistivity first metal portion 280a. However, by simultaneously forming the first opening 262a and the second opening 262b and simultaneously forming the first metal silicide layer 270a' and the second metal silicide layer 270b', the methods 10a and 10b are integrated and simplified while contact resistance of the multi-gate semiconductor device 200' is reduced.

Embodiments for semiconductor structures and method for manufacturing the same may be provided. The semiconductor structure may include nanowire structures, a gate structure formed around the nanowire structures, a source/drain structure, and a contact plug. The contact plug may extend below the top surface of the nanostructures, so that the contact plug is partially surrounded by the source/drain structure and therefore has a larger contact area with the source/drain structure.

In some embodiments, a semiconductor structure is provided. The semiconductor structure includes a substrate and nanostructures formed over the substrate and spaced apart from each other in a first direction. The semiconductor structure further includes a gate structure wrapping around the nanostructures and a semiconductor layer attached to the nanostructures in a second direction different from the first direction. The semiconductor structure further includes inner spacers sandwiched between the semiconductor layer and the gate structure in the second direction and a silicide layer formed over the semiconductor layer. In addition, a first portion of the semiconductor layer is sandwiched between the inner spacers and the silicide layer in the second direction.

In some embodiments, a semiconductor structure is provided. The semiconductor structure includes a substrate nanostructures formed over the substrate. The semiconductor structure further includes a semiconductor layer attached to the nanostructures and a gate structure wrapping around the nanostructures. The semiconductor structure further includes a contact plug formed over the semiconductor layer. In addition, the semiconductor layer has a first curvy sidewall surface facing the gate structure and a second curvy sidewall surface facing the contact plug.

In some embodiments, a semiconductor structure is provided. The semiconductor structure includes a substrate and nanostructures formed over the substrate and spaced apart from each other. The semiconductor structure further includes a gate structure wrapping around the nanostructures and a gate spacer formed on a sidewall of the gate structure. The semiconductor structure further includes a semiconductor layer attached to the nanostructures and inner spacers laterally separating the gate structure and the semiconductor layer. The semiconductor structure further includes a silicide layer formed over the semiconductor layer and a metal portion formed over the silicide layer. In addition, the metal portion has a top portion and a bottom portion, and the bottom portion of the metal portion has a curvy sidewall surface facing the inner spacers.

In some embodiments, a semiconductor structure is provided. The semiconductor structure includes a substrate and first nanostructures and second nanostructures formed over the substrate. The semiconductor structure further includes a first source/drain structure formed adjacent to the first nanostructures and a second source/drain structure formed adjacent to the second nanostructures. The semiconductor structure further includes a first contact plug formed over the first source/drain structure and a second contact plug formed over the second source/drain structure. In addition, a bottom portion of the first contact plug is lower than a bottom portion of the first nanostructures, and a bottom portion of the second contact plug is higher than a top portion of the second nanostructures.

In some embodiments, a semiconductor structure is provided. The semiconductor structure includes a substrate and first nanostructures and second nanostructures formed over the substrate. The semiconductor structure further includes a first gate structure surrounding the first nanostructure and a second gate structure surrounding first portions of the second nanostructures and a first source/drain semiconductor layer formed adjacent to the first gate structure. The semiconductor structure further includes a second source/drain semiconductor layer surrounding second portions of the second nanostructures and a first contact plug formed over the first source/drain semiconductor layer. The semiconductor structure further includes a second contact plug formed over the second source/drain semiconductor layer. In addition, the first contact plug extends below a topmost surface of the first nanostructures.

In some embodiments, a method for forming a semiconductor structure is provided. The method includes alternately stacking first semiconductor layers and second semiconductor layers over a substrate and patterning the first semiconductor layers and the second semiconductor layers to form a fin structure. The method further includes recessing the fin structure to form a recess and conformally forming a source/drain semiconductor layer over the recess. The method further includes filling the recess by a conductive material to form a contact plug over the source/drain semiconductor layer.

In some embodiments, a method for forming a semiconductor structure is provided. The method includes forming a fin structure over a substrate, and the fin structure includes first semiconductor layers and second semiconductor layers alternately stacked. The method further includes removing a portion of the fin structure to form a recess in a first source/drain region and forming a source/drain semiconductor layer in the recess. The method further includes forming a silicide layer over the source/drain semiconductor layer in the recess and forming a contact plug over the silicide layer in the recess. In addition, the source/drain semiconductor layer extends between the silicide layer and the first semiconductor layers.

In some embodiments, a method for forming a semiconductor structure is provided. The method includes alternately stacking first semiconductor layers and second semiconductor layers over a substrate and patterning the first semiconductor layers and the second semiconductor layers to form a first fin structure and a second fin structure. The method further includes recessing the first fin structure in a first source/drain region to form a first recess and forming a first source/drain semiconductor layer over the first recess. The method further includes removing the first semiconductor layers of the second fin structure in a second source/drain region to form gaps between the second semiconductor layers of the second fin structure in the second source/drain region and filling the gaps between second semiconductor layers in the second source/drain region by a second source/drain semiconductor layer. The method further includes filling the gaps between second semiconductor layers in the second source/drain region by a second source/drain semiconductor layer and filling the first recess by a conductive material to form a first contact plug over the first source/drain semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   nanostructures formed over the substrate and spaced apart from each other in a first direction;
   a gate structure wrapping around the nanostructures;
   a semiconductor layer attached to the nanostructures in a second direction different from the first direction;
   inner spacers sandwiched between the semiconductor layer and the gate structure in the second direction; and
   a silicide layer formed over the semiconductor layer,
   wherein a first portion of the semiconductor layer is sandwiched between the inner spacers and the silicide layer in the second direction.

2. The semiconductor structure as claimed in claim 1, wherein the first portion of the semiconductor layer has a convex surface in contact with the inner spacers.

3. The semiconductor structure as claimed in claim 2, wherein the first portion of the semiconductor layer has a recessed surface opposite to the convex surface and in contact with the silicide layer.

4. The semiconductor structure as claimed in claim 1, further comprising:
   a gate spacer formed on a sidewall of the gate structure, wherein the first portion of the semiconductor layer partially overlaps the gate spacer in the first direction.

5. The semiconductor structure as claimed in claim 4, wherein a dimension of the gate spacer is greater than a dimension of each of the inner spacers in the second direction.

6. The semiconductor structure as claimed in claim 4, wherein the silicide layer is in contact with a sidewall of the gate spacer.

7. The semiconductor structure as claimed in claim 1, further comprising:
   a contact plug formed over the silicide layer,
   wherein a portion of the silicide layer is sandwiched between the contact plug and the first portion of the semiconductor layer in the second direction.

8. The semiconductor structure as claimed in claim 1, further comprising:
   a contact plug formed over the silicide layer, wherein the contact plug comprises a top portion and a bottom portion connected to the top portion, and a dimension of the top portion is greater than a dimension of the bottom portion in the second direction.

9. A semiconductor structure, comprising:
a substrate;
nanostructures formed over the substrate;
a semiconductor layer attached to the nanostructures;
a gate structure wrapping around the nanostructures; and
a contact plug formed over the semiconductor layer,
wherein the semiconductor layer has a first curvy sidewall surface facing the gate structure and a second curvy sidewall surface facing the contact plug.

10. The semiconductor structure as claimed in claim 9, further comprising:
inner spacers formed between the nanostructures,
wherein the first curvy sidewall surface of the semiconductor layer is in contact with the inner spacers.

11. The semiconductor structure as claimed in claim 9, wherein a top surface of the contact plug is higher than a top surface of the gate structure, and a bottom surface of the contact plug is lower than a bottom surface of the gate structure.

12. The semiconductor structure as claimed in claim 9, further comprising:
a silicide layer formed over the semiconductor layer,
wherein the second curvy sidewall surface is covered by the silicide layer.

13. The semiconductor structure as claimed in claim 12, wherein a bottom portion of the silicide layer is lower than a bottom surface of a bottommost one of the nanostructures.

14. The semiconductor structure as claimed in claim 12, wherein the silicide layer has a first curvy sidewall surface in contact with the second curvy sidewall surface of the semiconductor layer and a second curvy sidewall surface facing the contact plug.

15. A semiconductor structure, comprising:
a substrate;
nanostructures formed over the substrate and spaced apart from each other;
a gate structure wrapping around the nanostructures;
a gate spacer formed on a sidewall of the gate structure;
a semiconductor layer attached to the nanostructures;
inner spacers laterally separating the gate structure and the semiconductor layer;
a silicide layer formed over the semiconductor layer; and
a metal portion formed over the silicide layer,
wherein the metal portion has a top portion and a bottom portion, and the bottom portion of the metal portion has a curvy sidewall surface facing the inner spacers.

16. The semiconductor structure as claimed in claim 15, wherein a top end of the curvy sidewall surface of the metal portion is higher than a bottom surface of the gate spacer.

17. The semiconductor structure as claimed in claim 15, wherein each of the inner spacers has a first concave sidewall vertically covered by the gate spacer.

18. The semiconductor structure as claimed in claim 15, wherein a top portion of the silicide layer is higher than a bottom surface of the gate spacer.

19. The semiconductor structure as claimed in claim 18, wherein a bottom portion of the silicide layer is lower than a bottom surface of a bottommost one of the inner spacers.

20. The semiconductor structure as claimed in claim 15, wherein a bottom end of the curvy sidewall surface of the metal portion is lower than a bottom surface of a bottommost one of the inner spacers.

* * * * *